(12) United States Patent
Hosokawa et al.

(10) Patent No.: US 8,040,041 B2
(45) Date of Patent: Oct. 18, 2011

(54) LIGHT EMITTING APPARATUS

(75) Inventors: Shoji Hosokawa, Tokushima (JP);
Hiroto Tamaki, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/735,468

(22) PCT Filed: Jan. 16, 2009

(86) PCT No.: PCT/JP2009/000159
§ 371 (c)(1),
(2), (4) Date: Sep. 22, 2010

(87) PCT Pub. No.: WO2009/093427
PCT Pub. Date: Jul. 30, 2009

(65) Prior Publication Data
US 2011/0031874 A1    Feb. 10, 2011

(30) Foreign Application Priority Data
Jan. 21, 2008 (JP) ................. 2008-010157

(51) Int. Cl.
*C09K 11/08* (2006.01)
*H01L 33/00* (2010.01)
*H05B 33/00* (2006.01)

(52) U.S. Cl. ......... 313/503; 313/512; 428/917; 362/800

(58) Field of Classification Search .................. None
See application file for complete search history.

(56) References Cited

U.S. PATENT DOCUMENTS

| | | | |
|---|---|---|---|
| 6,670,748 B2 * | 12/2003 | Ellens et al. .................. 313/503 |
| 7,597,823 B2 * | 10/2009 | Tamaki et al. ........ 252/301.4 F |
| 2003/0006469 A1 | 1/2003 | Ellens et al. | |
| 2003/0030368 A1 * | 2/2003 | Ellens et al. .................. 313/503 |
| 2006/0001352 A1 | 1/2006 | Maruta et al. | |
| 2007/0046169 A1 * | 3/2007 | Maeda et al. ................. 313/487 |
| 2007/0194695 A1 | 8/2007 | Yoon et al. | |
| 2009/0121608 A1 * | 5/2009 | Xie et al. ....................... 313/364 |
| 2009/0134775 A1 | 5/2009 | Watanabe et al. | |

FOREIGN PATENT DOCUMENTS

| | | |
|---|---|---|
| EP | 1935921 A1 | 6/2008 |
| JP | 2003-037295 | 2/2003 |
| JP | 2003-121838 | 4/2003 |
| JP | 2003-535477 | 11/2003 |
| JP | 2004-287323 | 10/2004 |
| JP | 2005-082788 | 3/2005 |

(Continued)

OTHER PUBLICATIONS

International Search Report in PCT/JP2009/000159 dated Mar. 3, 2009.

XIE, et al. "2-phosphor-converted white light-emitting diodes using oxynitride/nitride phosphors" Applied Physics Letters, 2007, vol. 90, p191101/1-191101/3.

*Primary Examiner* — Ashok Patel
(74) *Attorney, Agent, or Firm* — Foley & Lardner LLP

(57) ABSTRACT

A red nitride phosphor of formula (I) or (II), and two green phosphors of formulas (III) and/or (IV) are included.

$$M_w Al_x Si_y B_z N_{((2/3)w+x+(4/3)y+z)}:Eu^{2+} \quad (I)$$

M is any of Mg, Ca, Sr and Ba, and $0.5 \le w \le 3$, $x=1$, $0.5 \le y \le 3$ and $0 \le z \le 0.5$, $$M_p Si_q N_{((2/3)p+(4/3)q)}:Eu^{2+} \quad (II)$$

$1.5 \le p \le 2.5$ and $4.5 \le q \le 5.5$, $$M_x MgSi_z O_a X_b:Eu^{2+} \quad (III)$$

M is any of Ca, Sr, Ba, Zn and Mn, X is any of F, Cl, Br and I, and $6.5 \le x < 8.0$, $3.7 \le z \le 4.3$, $a = x+1+2z-b/2$ and $1.0 \le b \le 1.9$, $$Si_c Al_d O_f N_g:Eu^{2+} \quad (IV)$$

$c+d=6$, $5.0 \le c < 6$, $0 < d \le 1.0$, $0.001 < f \le 1$, $7 \le g < 8$.

10 Claims, 19 Drawing Sheets

FOREIGN PATENT DOCUMENTS

| | | |
|---|---|---|
| JP | 2006-307182 | 11/2006 |
| JP | 03-921545 | 3/2007 |
| JP | 03-940162 | 4/2007 |
| JP | 2007-116139 | 5/2007 |
| JP | 2007-227928 | 9/2007 |
| JP | 2007-262417 | 10/2007 |

* cited by examiner (a)

(b)

LIGHT EMITTING APPARATUS

TECHNICAL FIELD

The present invention relates to a light emitting apparatus capable of emitting color reproduction improved light, and in particular relates to a light emitting apparatus having combination of a semiconductor light emitting device and phosphors.

BACKGROUND ART

Light emitting apparatuses have been developed that have a light emitting device, and a phosphor. The light emitting device emits source light. The phosphor is excited by the source light, and can emit light with a different color from the source light. Thus, the light emitting apparatuses can emit light with various wavelengths based on the additive color mixture principle. For example, in the case where a light emitting device emits primary light with a wavelength in a range of from ultraviolet to a short visible wavelength to excite RGB (Red, Green and Blue) phosphors as wavelength conversion members by using the emitted light, red, blue and green as three primary colors are additively mixed to produce white light.

Light emitting apparatuses have been developed that have a combination of a blue LED (Light Emitting Diode), and phosphors that are excited by the blue light and emits green light and red light. The light emitting apparatuses can emit white light based on the additive color mixture principle. For example, Patent Document 1 discloses a nitride or nitride oxide phosphor with $\beta$-$Si_3N_4$ crystal structure ($\beta$-SIALON) that emits green light. A lighting apparatus has been developed that excites this phosphor and a phosphor of $CaSiAlN_3$:Eu as red luminescent type phosphor by using a blue LED for mixture of light emitted from the LED and the phosphors to emit white light.

In the case where the thus-configured lighting apparatus is used as back light source for liquid crystal display (LCD), color cathode-ray tube (CRT), projection tube (PRT), field emission display (FED), and vacuum fluorescent display (VFD), the NTSC ratio is typically used as an index of natural color tone reproduction on the display. The NTSC ratio refers to a ratio between a reproduction area and the area of a triangle obtained by connecting red, green and blue chromaticity coordinates (x, y) (red (0.670, 0.330), green (0.210, 0.710) and blue (0.140, 0.080)) in the XYZ colorimetric system defined by NTSC (National Television System Committee). Ideally, color reproduction preferably has an NTSC ratio of 100%. In small LCDs for cellular phones, which mainly use white LEDs, brightness is mainly required but color reproduction is comparatively considered less important. However, white LEDs have been used for notebook PCs and large TVs in these days. In this case, color reproduction is highly required.

However, in the lighting apparatus disclosed in Patent Document 1, the $\beta$-SIALON phosphor has a peak wavelength of 540 nm, and the $CaAlSiN_3$:Eu phosphor mainly has a peak wavelength of about 650 to 660 nm. Accordingly, it is difficult for the lighting apparatus disclosed in Patent Document 1 to provide color reproduction region that accurately covers the entire range of the NTSC ratio. As a result, there is a problem in that image reproduction cannot be highly accurately provided.

As for light emitting apparatuses that are currently typically used, and includes a blue light emitting device and a phosphor that is excited by the blue light and emits yellow light, the color reproduction (NTSC ratio) of the light emitting apparatuses is about 70%. This value is not enough for the color reproduction requirement. As for a white LED apparatus that has a combination of blue, red and green LEDs, although the white LED apparatus has an NTSC ratio of 100%, it is difficult to provide a white LED apparatus with long life at low cost. The reason is that the drive voltages for the LEDs are different, and deterioration properties of the LEDs are also different. As discussed above, there is an urgent need to develop an LCD back light apparatus that has improved color reproduction (NTSC ratio) required for large size LCDs, and improved brightness, life and cost.

For example, Patent Document 2 discloses a light emitting apparatus that has a combination of a blue light emitting device, and green luminescent type phosphor of $(Sr, Ba)_2SiO_4$:Eu and red luminescent type phosphor of $CaAlSiN_3$:Eu that are excited by the blue light and emit green light and red light. The peak wavelength of the $(Sr, Ba)_2SiO_4$:Eu phosphor can be varied in a range of 520 to 600 nm. Since a relatively wide color reproduction adjustment range can be provided, it is possible to provide wide color reproduction. However, since the phosphor in this light emitting apparatus greatly deteriorates, there is a problem in that the applicability of this light emitting apparatus is limited.

An example of conventional arts focusing color reproduction nature (NTSC ratio) in LCD can be provided by a liquid crystal display in Patent Document 3. This apparatus as back light source has a spectral peak in a range of 505 to 535 nm. This wavelength is obtained by a green luminescent type phosphor. It is disclosed that this phosphor contains any of europium, tungsten, tin, antimony, and manganese as activation agent. Specifically, $MgGa_2O_4$:Mn and $Zn_2SiO_4$:Mn are disclosed as the green luminescent type phosphor. However, in the case the aforementioned phosphor is installed together with a light emitting device with a peak wavelength of 430 to 480 nm, the excitation wavelength for this phosphor does not agree with the peak wavelength of the light emitting device. For this reason, the light emission efficiency of the phosphor is very poor. That is, phosphors for practical use level are required not only to have sufficient color reproduction but also to have excellent durability and high light emission efficiency for an excitation light source.

In addition to this, even in the case where phosphors have ideal color reproduction and luminescent properties, if the phosphors are unevenly distributed in an installation area of a light emitting apparatus, the light emission amounts of different colors will be unevenly mixed. This unevenness may cause color unevenness in the mixed light. For this reason, for example, LEDs will have large color tone variation. Consequently, it is difficult to provide LCDs with constant quality. That is, the properties of the entire light emission of a light emitting apparatus largely depend on the mixture state of phosphors.

Also, various types of filters are used as LCD back light filters. The absorptance of a filter varies accordance with light wavelength. For this reason, a light source is required to have a peak wavelength corresponding to the property of a LCD back light filter. However, as for green luminescent type phosphors, a green luminescent type phosphor has not been developed that has excellent properties such as luminescent properties and durability, and has a variable peak wavelength while keeping these properties. For example, although the aforementioned $\beta$-SIALON phosphor disclosed in Patent Document 1 has excellent luminescent properties, the $\beta$-SIALON phosphor can provide high brightness when emitting light with a peak wavelength of about 540 nm, but its brightness remarkably decreases when its peal wavelength is varied from about 540 nm. Accordingly, the β-SIALON phosphor disclosed in Patent Document 1 is not suitable for a filter that has a filter property corresponding to a peak wavelength of about 530 to 535 nm, which is shorter than 540 nm corresponding to the best peak wavelength of the β-SIALON phosphor. For this reason, a green luminescent type phosphor is required that has a peak wavelength of about 530 to 535 nm, and has excellent properties and the like. Also, a light source is required that has a peak wavelength corresponding to the filter property of an LCD back light filter. Also, a light source is required that can be adjusted to desired NTSC-based color reproduction. To achieve this, as discussed above, each of light sources is required to reduce color unevenness for luminescent property improvement, and wide regional luminescent properties of a combination of the light sources are required to be taken into account. That is, since the applied electric power difference or luminescent property difference among the light sources may cause color variation may occur in surface light emission provided by integrated small light source, a light source is required that can improve color variation. In other words, it is important to adjust the wavelength of a phosphor in accordance with light emission conditions in each light source and a color filter.

As for a combination of an excitation light source and a phosphor, it is required to improve the properties of the phosphor itself such as brightness, color reproduction region and reliability (phosphor deterioration), and additionally to improve the yield (color variation), cost and the like of a product as a light emitting apparatus.

[Patent Document 1] Japanese Patent Publication No. 3921545

[Patent Document 2] Japanese Patent Publication No. 3940162

[Patent Document 3] Japanese Patent Laid-Open Publication No. 2003-121838

[Patent Document 4] Japanese Patent Laid-Open Publication No. 2004-287323

DISCLOSURE OF INVENTION

Problems Solved by the Invention

The present invention is aimed at solving the aforementioned problems.

It is an object of the present invention to provide a light emitting apparatus capable of adjusting its color reproduction region to a desired range and of providing a wide color reproduction region.

Means to Solve the Problems

A light emitting apparatus according to a first aspect of the present invention includes a light emitting device, and two or more types of phosphors. The light emitting device can emit a light component. The two or more types of phosphors can be excited by the light component emitted from the light emitting device to emit visible light components with wavelengths different from the wavelength of the light component emitted from the light emitting device. The two or more types of phosphors include a red luminescent type phosphor containing at least one type of nitride phosphor, and at least one type of green luminescent type phosphor. The nitride phosphor is selected from the group consisting of phosphors of the following general formulas (I) and (II). A phosphor group is included that consists of phosphor types having an absolute specific gravity in a range of not less than 3.00 to not more than 4.30 among the two or more types of phosphors. The difference between the absolute specific gravity of each phosphor in the phosphor group and the mean absolute specific gravity of the phosphor types in the phosphor group falls within a range of ±16% of the mean absolute specific gravity. The content of the phosphor types in the phosphor group is not less than 90% by weight of the two or more types of phosphors.

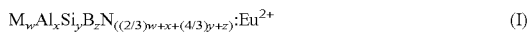  (I)

where M is at least one element selected from the group consisting of Mg, Ca, Sr and Ba, and $0.5 \leq w \leq 3$, $x=1$, $0.5 \leq y \leq 3$ and $0 \leq z \leq 0.5$,

  (II)

where M is at least one element selected from the group consisting of Mg, Ca, Sr and Ba, and $1.5 \leq p \leq 2.5$ and $4.5 \leq q \leq 5.5$, Also, a light emitting apparatus according to a first aspect of the present invention includes a light emitting device, and three or more types of phosphors. The light emitting device can emit a light component. The three or more types of phosphors can be excited by the light component emitted from the light emitting device to emit visible light components with wavelengths different from the wavelength of the light component emitted from the light emitting device. The three or more types of phosphors include a red luminescent type phosphor containing at least one type of nitride phosphor, and at least two types of green luminescent type phosphors. The nitride phosphor is selected from the group consisting of phosphors of the following general formulas (I) and (II). The at least two types of green luminescent type phosphors are selected from the group consisting of phosphors of the following general formulas (III) and (IV). The at least two types of green luminescent type phosphors have peak wavelengths in a range of not less than 529 to not more than 535 nm. A phosphor group is included that consists of phosphor types having an absolute specific gravity in a range of not less than 3.00 to not more than 4.30 among the three or more types of phosphors. The difference between the absolute specific gravity of each phosphor in the phosphor group and the mean absolute specific gravity of the phosphor types in the phosphor group falls within a range of ±16% of the mean absolute specific gravity of the phosphor types in the phosphor group. The content of the phosphor types in the phosphor group is not less than 90% by weight of the three or more types of phosphors.

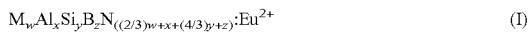  (I)

where M is at least one element selected from the group consisting of Mg, Ca, Sr and Ba, and $0.5 \leq w \leq 3$, $x=1$, $0.5 \leq y \leq 3$ and $0 \leq z \leq 0.5$,

  (II)

where M is at least one element selected from the group consisting of Mg, Ca, Sr and Ba, and $1.5 \leq p \leq 2.5$ and $4.5 \leq q \leq 5.5$,

  (III)

where M is at least one element selected from the group consisting of Ca, Sr, Ba, Zn and Mn, X is at least one element selected from the group consisting of F, Cl, Br and I, and $6.5 \leq x < 8.0$, $3.7 \leq z \leq 4.3$, $a=x+1+2z-b/2$ and $1.0 \leq b \leq 1.9$,

  (IV)

where $c+d=6$, $5.0 \leq c < 6$, $0 < d \leq 1.0$, $0.001 < f \leq 1$, $7 \leq g < 8$ In addition, it is preferable that the difference between the mean particle diameters of the phosphor types in the phosphor group falls within a range of ±20%.

In addition, it is preferable that the mean particle diameter of the phosphor types in the phosphor group is not less than 5 μm and not more than 30 μm.

In addition, it is preferable that the surfaces of the phosphor types in the phosphor group is subjected to substantially the same surface treatment to provide a substantially uniform surface state.

In addition, a compound containing at least Si can be included in the surfaces of the phosphor types in the phosphor group.

In addition, it is preferable that $Ca_8MgSi_4O_{16}Cl_{2-\delta}$:Eu ($0 \leq \delta \leq 1.0$) and $Si_{6-x}Al_xO_yN_{8-y}$:Eu ($x \leq 1$, $y \leq 1$) are included as the at least two types of green luminescent type phosphors. Also, it is preferable that $(Ca_{1-x}Sr_x)_2Si_5N_8$:Eu ($0 \leq x \leq 1.0$) and $(Ca_{1-x}Sr_x)AlSiB_yN_{3+y}$:Eu ($0 \leq x \leq 1.0$, $0 \leq y \leq 0.5$) are included as the red luminescent type phosphor.

In addition, it is preferable that the light emitting device has a peak wavelength in a wavelength range from near ultraviolet to blue.

In addition, it is preferable that the light emitting device has a peak wavelength in a range of 445 to 470 nm.

In addition, it is preferable that the apparatus can emit white light by mixture of a plurality of different color light components, and one of the plurality of different color light components is provided by blending two or more light components with different peak wavelengths the difference of which falls within a range of not more than 50 nm.

In addition, it is preferable that, the content of the at least two types of green luminescent type phosphors is not less than 60% and not more than 95% by weight of the three or more types of phosphors, and/or the content of said red luminescent type phosphor is not less than 5% and not more than 40% by weight of the three or more types of phosphors.

Effects of the Invention

According to a light emitting apparatus of the present invention, since, among phosphors used in the light emitting apparatus, a large amount of certain types of phosphors are included that have similar absolute specific gravities, the phosphors can be similarly deposited so that the phosphors can be substantially uniformly diffused. Accordingly, it is possible to greatly reduce uneven distribution of the phosphors in a radiation area. Therefore, it is possible to provide a light emitting apparatus capable of emitting light with reduced color unevenness. In addition, the wavelength region of each color can be controlled by variation of the mixture ratio of phosphors. As a result, combination of the thus-controlled colors can provide a light emitting apparatus capable of increasing the color reproduction region of the entire mixture light.

DETAILED DESCRIPTION OF THE PREFERRED EMBODIMENTS

The following description will describe embodiments according to the present invention with reference to the drawings. It should be appreciated, however, that the embodiments described below are illustrations of a light emitting apparatus used therein to give a concrete form to technical ideas of the invention, and a light emitting apparatus of the invention is not specifically limited to description below. Furthermore, it should be appreciated that the members shown in claims attached hereto are not specifically limited to members in the embodiments. Unless otherwise specified, any dimensions, materials, shapes and relative arrangements of the members described in the embodiments are given as an example and not as a limitation. Additionally, the sizes and the arrangement relationships of the members in each of drawings are occasionally shown larger exaggeratingly for ease of explanation. Members same as or similar to those of this invention are attached with the same designation and the same reference numerals, and their description is omitted. In addition, a plurality of structural elements of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like.

In description of the present invention, relationship between color name and chromaticity coordinates, relationship between light wavelength range and monochromatic light, and the like are based on the JIS standard (JIS Z8110) unless otherwise noted. Specifically, a range of 380 to 455 nm corresponds to the bluish violet color, a range of 455 to 485 nm corresponds to blue, a range of 485 to 495 nm corresponds to bluish green, a range of 495 to 548 nm corresponds to green, a range of 548 to 573 nm corresponds to yellowish green, a range of 573 to 584 nm corresponds to yellow, a range of 584 to 610 nm corresponds to apricot, and a range of 610 to 780 nm corresponds to red.

First Embodiment

FIG. 1 shows a light emitting apparatus 60 according to a first embodiment of the present invention. FIG. 1(*a*) is a perspective view showing the light emitting apparatus 60. FIG. 1(*b*) is a cross-sectional view showing the light emitting apparatus 60 shown in FIG. 1(*a*) taken along the line IB-IB'. The illustrated light emitting apparatus 60 includes a light emitting device 2, and at least two types of phosphors 3, as shown in FIG. 1(*b*). The light emitting device 2 can emit light. The two or more types of phosphors 3 can be excited by the light emitted from the light emitting device 2 to emit light with wavelengths different from the wavelength of the light emitted from the light emitting device 2.

That is, the light emitting apparatus 60 includes a plurality of types of phosphors 3. The phosphors 3 according to the first embodiment 1 include a red luminescent type phosphor containing at least one type of nitride phosphor selected from the group consisting of phosphors of the following general formulas (I) and (II), and at least one type of green luminescent type phosphor. Phosphor types among all the types of phosphors have an absolute specific gravity in a range of not less than 3.00 to not more than 4.30. The difference d between the mean absolute specific gravity A of phosphor types and the absolute specific gravity of each of the phosphors 3 falls within a range of ±16% of the mean absolute specific gravity A ($d \leq |0.16 A|$), preferably within a range of ±11% of the mean absolute specific gravity A ($d \leq |0.11 A|$). Here, the mean absolute specific gravity refers to a value that, as for the phosphor types having an absolute specific gravity in a range of not less than 3.00 to not more than 4.30 among all the types of phosphors installed in the light emitting apparatus, is obtained by dividing the accumulated value of the absolute specific gravities of the phosphor types by the number of these different phosphor types. In addition, the content of the phosphor types having an absolute specific gravity in a range of not less than 3.00 to not more than 4.30 is not less than 90% by weight, preferably 95% by weight. The absolute specific gravities are measured by Micromeritics AccuPyc1330 of Shimadzu Corporation. The measurement principle is a fixed volume expansion method. This measurement equipment includes a fixed volume sample chamber and an expansion chamber. A sample is placed in the sample chamber. Gas is supplied only to the sample chamber to increase pressure. After that, a valve between the sample chamber and the expansion chamber is opened. Thus, the density of the sample can be obtained based on the pressure difference between pressures before and after the valve opening.

$$M_w Al_x Si_y B_z N_{((2/3)w+x+(4/3)y+z)}:Eu^{2+} \quad (I)$$

where M is at least one element selected from the group consisting of Mg, Ca, Sr and Ba, and $0.5 \leq w \leq 3$, $x=1$, $0.5 \leq y \leq 3$ and $0 \leq z \leq 0.5$, $$M_p Si_q N_{((2/3)p+(4/3)q)}:Eu^{2+} \quad (II)$$

where M is at least one element selected from the group consisting of Mg, Ca, Sr and Ba, and $1.5 \leq p \leq 2.5$ and $4.5 \leq q \leq 5.5$ In addition, the green luminescent type phosphor preferably includes at least two types of phosphors having the following general formulas (III) and (IV). The at least two types of green luminescent type phosphors preferably have peak wavelengths in a range of not less than 529 to not more than 535 nm. The thus-configured light emitting apparatus can suitably used in combination with a filter that has a filter property corresponding to a peak wavelength in a range of not less than 529 to not more than 535 nm.

$$M_x MgSi_z O_a X_b:Eu^{2+} \quad (III)$$

where M is at least one element selected from the group consisting of Ca, Sr, Ba, Zn and Mn, X is at least one element selected from the group consisting of F, Cl, Br and I, and $6.5 \leq x < 8.0$, $3.7 \leq z \leq 4.3$, $a=x+1+2z-b/2$ and $1.0 \leq b \leq 1.9$, $$Si_c Al_d O_f N_g:Eu^{2+} \quad (IV)$$

where $c+d=6$, $5.0 \leq 6$, $0 < d \leq 1.0$, $0.001 < f \leq 1$, $7 \leq g < 8$ In addition, the difference between the mean particle diameters of the phosphors 3 preferably falls within a range of ±20%. In the case where the light emitting apparatus 60 includes only the phosphors that have the above specific conditions in the absolute specific gravity or the particle diameter, it is possible to provide a uniform mixture state of the phosphors 3 in the light emitting apparatus 60. Consequently, the light emitting apparatus 60 can provide mixed color light with greatly-reduced color unevenness.

As for specific wavelength ranges of colors of light components that compose the mixed color light of the light emitting apparatus, a specific blue range is not less than 445 and not more than 470 nm, a specific green range is not less than 510 and not more than 550 nm, and a specific red range is not less than 600 and not more than 670 nm. It is preferable that the peak wavelengths of the light component fall within these wavelength ranges. In this case, it is possible to emit light with wide color reproduction range. Green and red colors emitted by the green and red luminescent type phosphors used in the light emitting apparatus do not necessarily have relationship between color name and chromaticity coordinate defined by JIS standard Z8110. Also, each color component can be provided by light emitted by a single type of or a plurality of types of light emitting devices or phosphors. In the case where one color component is provided by light emitted by a single type of or a plurality of types of light emitting devices or phosphors, the one color component is preferably provided by blending two or more light components with different peak wavelengths the difference of which falls within a range of not more than 50 nm. In this configuration, it is possible to reduce color tone variation. Therefore, it is possible to provide high quality light emission. The light emitting apparatus 60 includes phosphors with absolute specific gravities in a range of not less than 3.00 and not more than 4.30. The difference between the absolute specific gravity of each phosphor type included as the phosphor 3 and the mean absolute specific gravity of phosphor types included as the phosphor 3 falls within a range of ±16%. Also, the mean particle diameter of phosphor types included as the phosphor 3 is not less than 5 μm and not more than 30 μm.

The light emitting apparatus mixes light components with colors such as blue, green and red, and thus emits mixed-color light. The light emitting apparatus according to the first embodiment includes the light emitting device 2 that emits light in a range of near ultraviolet to blue, and the green luminescent type and red luminescent type phosphors that absorb a part of the light emitted from the light emitting device 2 and emit green light and red light. These three primary light colors are mixed so that white light is emitted from the light emitting apparatus 60. Specifically, the light emitting device 2 can be an LED having a peak wavelength in a range of 445 to 470 nm. FIG. 2 shows LED light emission spectra. FIG. 2 shows the light emission spectra of two types of LEDs having peak wavelengths of 450 and 460 nm. Examples of the phosphors are provided below that can be excited by the LED and emit red light or green light.

(Red Luminescent Type Phosphor)

An example of the red luminescent type phosphor can be provided by an Eu-activated nitride phosphor containing group II element M, Si, Al, B and N represented by the following general formula (I).

$$M_w Al_x Si_y B_z N_{((2/3)w+x+(4/3)y+z)}:Eu^{2+} \quad (I)$$

M is at least one element selected from the group consisting of Mg, Ca, Sr and Ba, and $0.5 \leq w \leq 3$, $x=1$, $0.5 \leq y \leq 3$ and $0 \leq z \leq 0.5$. The red luminescent type phosphor represented by the general formula (I) has a light emission peak wavelength of not less than 630 nm and not more than 670 nm.

An example of the phosphor represented by the general formula (I) can be represented by $M_w AlSiB_z N_{((2/3)w+(7/3)+z)}:Eu^{2+}$, where M is at element selected from the group consisting of Mg, Ca, Sr and Ba, and $0.5 \leq w \leq 1.5$, $x=1$ and $0 \leq z \leq 0.5$. A more preferable example of the phosphor represented by the general formula (I) can be represented by $CaAlSiB_y N_{3+y}:Eu$ ($0 \leq y \leq 0.1$, and in actual composition $y=0.005$). Its specific gravity is 3.24 g/cm³. FIG. 3 shows the light emission spectrum of the $CaAlSiB_y N_{3+y}:Eu$ phosphor. FIG. 3 shows the light emission spectrum of the $CaAlSiB_y N_{3+y}:Eu$ phosphor when excited by light of 460 nm. The $CaAlSiB_y N_{3+y}:Eu$ phosphor has a peak wavelength of 650 nm.

In addition, another example of the red luminescent type phosphor can be provided by a phosphor represented by the following general formula (II).

$$M_p Si_q N_{((2/3)p+(4/3)q)}:Eu^{2+} \quad (II)$$

where M is at least one element selected from the group consisting of Mg, Ca, Sr and Ba, and $1.5 \leq p \leq 2.5$ and $4.5 \leq q \leq 5.5$. The red luminescent type phosphor represented by the general formula (II) has a light emission peak wavelength of not less than 600 nm and not more than 650 nm.

In addition, an example of preferable nitride phosphor represented by the general formula (II) can be provided by $Ca_2Si_5N_8:Eu^{2+}$. Its specific gravity is 3.08 g/cm³. In addition, another example of preferable nitride phosphor represented by the general formula (II) can be provided by $(Ca, Sr)_2Si_5N_8:Eu^{2+}$. Its specific gravity is 3.59 g/cm³. FIG. 4 shows the light emission spectrum of the $Ca_2Si_5N_8:Eu$ phosphor when excited by light of 460 nm.

Although the nitride phosphors represented by the above general formulas (I) and (II) are activated by Eu, Eu can be partially substituted by at least one rare earth element selected from the group consisting of Sr, TmYb, Y, La, Ce, Pr, Nd, Sm, Eu, Gd, Tb, Dy, Ho, Er and Lu.

In the case where Ca is used as M, Ca is preferably used alone. However, Ca can be partially substituted by Sr, Mg, Ba, Sr, and Ba. In a case where Ca is partially substituted by Sr, it is possible to adjust the light emission wavelength peak of the nitride phosphor.

Although Si is also preferably used alone in the phosphor, Si can be also partially substituted by C or Ge as a group IV element. In the case where Si is used alone, the nitride phosphor can be inexpensively produced and can have good crystallinity.

Although the activator Eu is preferably used alone, Eu can be partially substituted by Sr, Tm, Yb, Y, La, Ce, Pr, Nd, Sm, Gd, Tb, Dy, Ho, Er or Lu. In the case of partial substitution of other element for Eu, the element serves as coactivator. In this case, color tone can be varied. Accordingly, it is possible to adjust luminescent properties.

The nitride phosphors can contain 1 to 500 ppm of at least one element selected the group consisting of group I elements of Cu, Ag and Au; group III elements of Ga and In; group IV elements of Ti, Zr, Hf, Sn and Pb; group V elements of P, Sb and Bi; and a group VI element of S. Similar to group I elements, these elements fly away in burning of production process. Accordingly, the added amounts of these elements after burning become smaller than the amounts of these elements that are originally added to the material. For this reason, the amounts of these elements that are originally added to the material are preferably adjusted to not more than 1000 ppm. In the case where these elements are added, it is possible to adjust light emission efficiency.

Also, in the nitride phosphors, the mole concentration ratios of Fe, Ni, Cr, Ti, Nb, Sm and Yb are preferably not more than 0.01 relative to the mole concentration of M. The reason is that, if the nitride phosphors contain large amounts of Fe, Ni, Cr, Ti, Nb, Sm and Yb, the light emission brightness of the nitride phosphor will decrease.

The nitride phosphors represented by the above general formulas (I) and (II) will be discussed later in more detail. The nitride phosphors have absolute specific gravities that satisfy the aforementioned condition of the absolute specific gravity difference between each of the nitride phosphor and the green luminescent type phosphor discussed below. Accordingly, it is permeable that a plurality of types of phosphors include one of or both of phosphors represented by the general formulas (I) and (II) as red luminescent type phosphor together with the following green luminescent type phosphor.

(Green Luminescent Type Phosphor)

Also, an example of the green luminescent type phosphor can be provided by an Eu-activated halogen oxide phosphor represented by the following general formula (III).

$$M_x Eu_y MgSi_z O_a X_b \quad (III)$$

where M is at least one element selected from the group consisting of Ca, Sr, Ba, Zn and Mn, X is at least one element selected from the group consisting of F, Cl, Br and I, and $6.5 \leq x < 8.0$, $0.01 \leq y \leq 2.0$, $3.7 \leq z \leq 4.3$, $a = x+y+1+2z-b/2$ and 1.0

The above general formula (III) can be also represented by the general formula of $M_x MgSi_z O_a X_b:Eu^{2+}$ (where M is at least one element selected from the group consisting of Ca, Sr, Ba, Zn and Mn, X is at least one element selected from the group consisting of F, Cl, Br and I, and $6.5 \leq x < 8.0$, $3.7 \leq z \leq 4.3$, $a = x+1+2z-b/2$ and $1.0 \leq b \leq 1.9$) in a manner that separately represents a base material of phosphor and Eu as activator.

The phosphor represented by the general formula (III) contains at least one element selected from the group consisting of Ca, Sr, Ba, Zn and Mn, and preferably includes Ca. In the case where Ca is included, Ca may be partially substituted by Mn, Sr, or Ba. Also, the phosphor represented by the general formula (III) contains at least one element selected from the group consisting of Si, Ge and Sn, and preferably includes Si. In the case where Si is included, Si may be partially substituted by Ge or Sn. Also, the phosphor represented by the general formula (III) contains at least one element selected from the group consisting of F, Cl, Br and I, and preferably includes Cl. In the case where Cl is included, Cl may be partially substituted by F, Br or I. A preferable example of the phosphor represented by the general formula (III) can be provided by $Ca_8 MgSi_4 O_{16} Cl_{2-\delta}:Eu^{2+}$ ($0 \leq \delta \leq 1$, where δ represents composition deviation of Cl). Its specific gravity is 3.29 g/cm³.

The phosphor represented by the above general formula (III) has a light emission peak wavelength in a wavelength range of green of not less than 510 and not more than 530 nm to yellow. FIG. 5 shows the light emission spectrum of $Ca_8 MgSi_4 O_{16} Cl_{2-\delta}:Eu^{2+}$ as one example of general formula (III) when excited by light of 460 nm.

In addition, another example of the green luminescent type phosphor can be provided by a phosphor represented by the following general formula.

$$Si_c Al_d Eu_e O_f N_g \quad (IV)$$

where $c+d+e=6$, $5.0 \leq c < 6$, $0 < d \leq 1.0$, $0.001 \leq e \leq 0.06$, $0.001 < f \leq 1$, $7 \leq g < 8$.

The above general formula (III) can be also represented by the general formula of $Si_c Al_d O_f N_g:Eu^{2+}$ ($c+d=6$, $5.0 \leq c < 6$, $0 < d \leq 1.0$, $0.001 < f \leq 1$, $7 \leq g < 8$) in a manner that separately represents a base material of phosphor and Eu as activator.

This phosphor contains at least one element selected from the group consisting of Ca, Sr, Ba, Zn and Mn, and preferably includes Ca. In the case where Ca is included, Ca may be partially substituted by Mn, Sr, or Ba. Also, the green phosphor represented by the above general formula (IV) has a light emission peak wavelength in a wavelength range of not less than 530 and not more than 555 nm. Specifically, an example of phosphor (IV) can be represented by $Si_{6-x} Al_x O_y N_{8-y}:Eu^{2+}$ having a β-SIALON crystal structure. FIG. 6 shows the light emission spectrum of this phosphor when excited by light of 460 nm. Specifically, an exemplary composition of β-SIALON can be provided by $Si_{5.775} Al_{0.21} Eu_{0.015} O_{0.023} N_{7.910}$, $Si_{5.80} Al_{0.185} Eu_{0.015} O_{0.023} N_{7.918}$ and the like, however compositions of β-SIALON are not limited to these. The specific gravity of $Si_{5.775} Al_{0.21} E_{0.015} O_{0.023} N_{7.910}$ is 3.23 g/cm³.

The green luminescent type phosphors represented by the above formulas (III) and (IV) contain at least one of rare earth elements but essentially contain Eu. The rare earth refers to a generic name for total 17 elements consisting of scandium, yttrium and lanthanoid group elements. Eu is the most preferable among them. Eu may be partially substituted by Ce, Pr, Nd, Sm, Tb, Dy, Ho, Er, Tm and Yb. Preferably, Eu may be partially substituted by Ce, Pr, Nd, Sm, Tb, Dy, Ho and Tm.

A peak wavelength of the green luminescent type phosphors represented by the above formulas (III) and (IV) can be adjusted by adjustment of mixture ratio of the phosphors represented by the formulas (III) and (IV).

In addition, another example of the green phosphor can be provided by phosphors represented by general formulas of $SrSi_2 O_2 N_2:Eu^{2+}$, $SrGa_2 S_4:Eu^{2+}$, $Ba_3 Si_6 O_{12-x} N_{2+y}:Eu^{2+}$ ($-2 < x < 2$, $-2 < y < 2$, where x and y represents composition deviations of O and N). The green phosphor of $SrSi_2 O_2 N_2:Eu^{2+}$ has a light emission peak wavelength in a wavelength range of green of not less than 530 and not more than 555 nm to yellow. Its absolute specific gravity is 3.67 g/cm³. Also, the green phosphor of $SrGa_2 S_4:Eu^{2+}$ has a light emission peak wavelength in a wavelength range of not less than 530 and not more than 540 nm. Its absolute specific gravity is 3.62 g/cm$^3$. Also, the green phosphor of $Ba_3Si_6O_{12-x}N_{2+y}$:$Eu^2$ has a light emission peak wavelength in a wavelength range of green of not less than 520 and not more than 540 nm to yellow. Its absolute specific gravity is 4.18 g/cm$^3$.

A production method of the phosphors according to the embodiment is not limited. Known methods can be used. An example of the production method can be shown as follows. Starting materials for elements to compose the composition of the phosphor can be the elements alone, or oxide or carbonate of the elements. These materials are measured to provide a predetermined composition ratio. In addition, various additive elements, boron and the like are suitably added as flux to materials. Then, the materials with the added flux are mixed in a wet or dry manner by a mixer. This can facilitate solid state reaction so that particles are formed that have a uniform size. The mixer can be a ball mill, which is typically industrially used. Also, the materials can be pulverized by a pulverizer such as vibrating mill, roll mill or jet mill to increase their specific surface areas. In order that the specific surfaces of the materials can fall within a certain rang, the materials may be classified by a wet separator such as settling tank, hydrocyclone or centrifuge, or a dry classifier such as cyclone or air separator. Such a wet separator or dry classifier is typically industrially used. The aforementioned mixed materials are placed inside a crucible such as SiC, quartz, alumina or BN crucible, and are burned in a reducing atmosphere of $N_2$ and $H_2$. The burning atmosphere can be argon atmosphere, ammonia atmosphere, or the like. The materials are burned at a predetermined temperature for predetermined time. The target phosphor powder is obtained by pulverization, dispersion, filtration and the like of the burned material. Solid and liquid substances can be separated by a typically industrially used method such as filtration, suction filtration, pressure filtration, centrifugal separation, decantation or the like. Substances can be dried by a typically industrially used device such as vacuum dryer, heating dryer, conical dryer or rotary evaporator.

The phosphor can be subjected to surface treatment that provides an organic functional group to the surface by using a silane coupling agent. Alternatively, the phosphor can be subjected to surface treatment that covers the surface of the phosphor with inorganic oxide such as silica or alumina, inorganic phosphate, sulfate, carbonate, or the like. In the case where the phosphor is subjected to surface treatment of a silane coupling agent, commercially available silane coupling agents can be used for known dry or wet surface treatment. In this case, it is possible to adjust the wettability between a transparent resin such as silicone resin composition and various types of phosphors. Adjustment of wettability can adjust sedimentation. An example of surface treatment using silica can be provided by a method that uses tetraethyl orthosilicate (TEOS) so that a silica layer is deposited on the surface to the phosphor by using ammonia or the like as catalyst. In the case where tetraethyl orthosilicate is used, known dry or wet surface treatment can be used. Similar to the case of a silane coupling agent, adjustment of the surface conditions of various types of phosphors can adjust the wettability between a transparent resin and the various types of phosphors, and can adjust sedimentation.

(Particle Diameter)

It is preferable that the particle diameters of the phosphors fall within a range 5 to 30 μm, and more preferably 5 to 20 μm in terms of installation on the light emitting apparatus. In addition, it is preferable that the content of a phosphor with the above mean particle diameter is high. Also, the particle size distribution is preferably narrow. In the case where a phosphor is used that has less unevenness of particle diameter or particle size distribution, and has a large particle diameter and excellent optical properties, color unevenness can be reduced. Therefore, it is possible to provide a light emitting apparatus with excellent color tone. Accordingly, in the case where the phosphor has a particle diameter in the above range, light absorption and conversion efficiencies can be high. A phosphor with a particle diameter less than 5 μm is likely to form aggregate. The above particle diameter values are particle diameters measured by air permeation method in F.S.S.S.No (Fisher Sub Sieve Sizer's No). Specifically, 1 cm$^3$ of a sample is measured under environmental conditions at temperature of 25° C. and humidity of 70%, and is placed in a special tubular vessel. Subsequently, air flows through the vessel at a constant pressure. Thus, a relative surface area value is obtained based on the pressure difference. The mean particle diameter value is obtained by conversion from the relative surface area value.

The following description will describe a light emitting apparatus according to one embodiment of the present invention. Various shapes of light emitting apparatuses including a light emitting device are known such as bullet type and surface mount type light emitting apparatus. The bullet type light emitting apparatus typically refers to a light emitting apparatus that has a bullet-shaped resin forming its external surface. Also, the surface mount type light emitting apparatus refers to a light emitting apparatus that has a light emitting device and resin accommodated in a recessed accommodation portion. The light emitting apparatus 60 shown in FIG. 1 is a side view type light emitting apparatus, which is one of surface mount type light emitting apparatuses. The side view type light emitting apparatus refers to a light emitting apparatus that emits light from its side surface adjacent to an installation surface of the light emitting apparatus. This light emitting apparatus can be thin. However, the type of light emitting apparatus according to the present invention is not limited to these. A light emitting apparatus according to the present invention can be configured in a top view type or other type light emitting apparatus.

(Outline)

In light emitting apparatus formation, a pair of positive and negative external terminals are inserted into metal molds. Subsequently, the metal molds are closed. The closed metal molds are provided with melted polyphthalamide resin through a gate that is located on a lower portion opposed to the main surface of a case. After that, the resin is cured. As a result, the case is formed. The case has an opening that can accommodate a light emitting device. The positive and negative external terminals are formed integrally with the case. The main surfaces of the positive and negative external terminals are exposed on one side. Outer lead portions of the positive and negative external terminals are exposed from the case side surface. The outer lead portions are inwardly bent on edges on a surface opposed to the light emission surface. An LED chip with a main wavelength peak of 450 nm is mounted onto the bottom surface of the opening of the thus-formed case with an epoxy resin by die-bonding. The LED chip is electrically connected to external terminals through wire. An LED chip with a main wavelength peak of 460 nm is similarly produced.

In this light emitting apparatus, the light emitting device is adhered by a die-bonding material on the bottom surface of the recessed portion of the case for mounting the light emitting device that opens upward. The light emitting device is covered by a transparent resin member that includes the distributed phosphors. An upper electrode of the light emitting device is electrically connected to a first external terminal through the first conductive member. A lower electrode is electrically connected to a second external terminal through the second conductive member. In addition, a light reflective material covers the interior surface of the recessed portion of the case for mounting the light emitting device.

The light emitting apparatus 60 shown in FIG. 1 is now described. The light emitting apparatus 60 has a recessed portion 14, and a light emitting device 2 accommodated inside the recessed portion 14. The recessed portion 14 is filled with a resin member containing a phosphor 3. The recessed portion 14 is a part of a package 17. That is, the package 17 is composed of the recessed portion 14 and a support member 16 coupled to the recessed portion 14. As shown in FIG. 1(b), positive and negative lead terminals 15 are interposed between the recessed portion 14 and the support member 16. Parts of the lead terminals 15 form a light emitting device 2 mount surface in the recessed portion 14. Parts of the lead terminals 15 are exposed outward of the package 17, and extend along the external shape of the package 17. The light emitting device 2 is mounted on and electrically connected to the lead terminals 15 in the recessed portion 14. The light emitting device 2 is supplied with electric power from the outside through the lead terminals 15. FIG. 1(a) shows a typical light emitting apparatus 60 installation state. That is, the light emitting apparatus 60 is installed with a wide surface of the light emitting apparatus 60 being arranged serving as the bottom side. The wide surface is perpendicular to a surface where the light emitting device 2 is mounted. In this configuration, the light emitting apparatus 60 can emit light in a direction substantially parallel to the light emitting device mount surface. In other words, the light emitting apparatus 60 can emit light from a side surface adjacent to the instillation surface of the light emitting apparatus.

Specifically, the package 17 is formed integrally with the positive and negative lead terminals 15 with one end of each of the lead terminals 15 being inserted in the package 17. In other words, the package 17 has the recessed portion 14 that can accommodate the light emitting device 2 on the main surface side. One end of the positive lead terminal 15 and one end of the negative lead terminal 15 are arranged on the bottom surface of the recessed portion 14, and are spaced away from each other. The main surfaces of the positive and negative lead terminals 15 are exposed. Space between the positive and negative lead terminals 15 is filled with an insulating filling material. In the present invention, as for the light emission surface formed on the main surface side of the light emitting apparatus, the shape of the light emission surface is not limited to a rectangular shape shown in FIG. 1. The shape of the light emission surface can be an ellipse shape, or the like. According to shape variation of the light emission surface to various shapes, the package side wall portion with the recessed portion 14 can maintain its mechanical strength, and additionally to increase the size of the light emission surface as much as possible. Therefore, even when the light emitting apparatus is configured thin, the light emitting apparatus can emit light in a wide area.

The positive and negative lead terminals 15 of the light emitting apparatus 60 according to the first embodiment is inserted so that the other end of each lead terminal 15 protrudes from the package side surface. The protruding parts of the lead terminals 15 are bent toward the back surface opposed to the main surface of the package 17, or toward the mount surface perpendicular to the aforementioned main surface. Although the shape of the interior wall surface forming the recessed portion 14 is not limited, in the case where the recessed portion 14 accommodates the light emitting device 4, the interior wall surface is preferably tapered so that its inner diameter gradually increases toward the opening side. According to this configuration, the light emitted from the end surfaces of the light emitting device 2 can efficiently outgo toward the light emission viewing plane side. In addition, in order to increase light reflection, the interior wall surface of the recessed portion preferably has light reflection function. The light reflection function can be provided by plating the interior wall surface of the recessed portion with metal such as silver.

In the light emitting apparatus 60 of the first embodiment, the light emitting device 2 is mounted in the recessed portion 14 of the thus-configured package 1. In addition, the recessed portion is filled with transparent resin to cover the light emitting device 2. Thus, a sealing member 18 is formed. The transparent resin contains the phosphor 3. A silicone resin composition, a denatured silicone resin composition or the like is preferably used as the transparent resin. However, a transparent, insulating resin composition such as epoxy resin composition, denatured epoxy resin composition and acrylic resin composition or the like can be also used.

(Light Emitting Device)

The light emitting device can emit light from the ultraviolet range to the visible range. A light emitting device is preferably used that has a light emission peak wavelength in a range of 240 to 480 nm, more preferably 445 to 470 nm, and includes light emission layers that can emit light with a light emission wavelength capable of efficiently exciting a phosphor material. The reason is that, in the case where an excitation light source with a light emission wavelength in the above range, the phosphor can have high luminescent efficiency. In the case where the semiconductor light emitting device is used as an excitation light source, it is possible to provide a highly efficient and stable light emitting apparatus that has high output-input lineality and high mechanical shock resistance. Visible light in the visible shorter wavelength side range roughly corresponds to the blue light range. In this specification, a range from the near ultraviolet range to the visible shorter wavelength side range refers to a range of about 240 to 500 nm. A nitride semiconductor light emitting device is now described as the light emitting device. However, the light emitting device is not limited to this.

Specifically, it is preferable that the light emitting device is a nitride semiconductor device containing In or Ga. When excited by excitation light in a range of about near ultraviolet to blue, the phosphor according to this embodiment emits strong light. For this reason, a light emitting device is required that has a light emission wavelength in the above range. At least one phosphor is excited by the light from the light emitting device, and emits light with a predetermined color. Also, this light emitting device can have a narrow light emission spectrum width. For this reason, this light emitting device can emit light with a light emission spectrum that can efficiently excite the phosphor but substantially does not affect the color tone variation of the light emitting apparatus.

An LED chip as an example of the nitride semiconductor device is used as the light emitting device 2 according to the first embodiment. Although suitable known light emitting devices can be used as the light emitting device 2, in the case where a light emitting apparatus includes a phosphor material, semiconductor light emitting devices are preferably used that can emit light capable of exciting the phosphor material. Examples of such semiconductor light emitting devices can be provided by various types of semiconductors such as ZnSe, InGaN and GaN doped with various types of impurities. A suitable example can be provided by a nitride semiconductor ($In_X Al_Y Ga_{1-X-Y} N$, $0 \leq X$, $0 \leq Y$, X+Y) that can emit light with a short wavelength capable of efficiently exciting the phosphor material. The light emission wavelength can be selected by the variation of materials and mixed crystal ratios of the semiconductor layer. This device can be formed by growing a semiconductor such as InGaN and GaN as light emitting layer on a substrate by MOCVD or the like.

Exemplary structures of semiconductors can be provided by homo structure, hetero structure an double-hetero structure with MIS junction, PI junction, PN junction, etc. The light emission wavelength can be selected by the variation of materials and mixed crystal ratios of the nitride semiconductor layer. The semiconductor layer can have a single- or multi-quantum-well structure provided with thin layer(s) for quantum effect.

Although the light emitting device 2 used in this embodiment has the positive and negative electrodes formed on the same surface side, the positive and negative electrodes can be formed on surfaces opposed to each other. The positive and negative electrodes are not necessarily formed one. Two or more electrodes can be formed for each of the positive and negative electrodes. Since the light emitting device as excitation light source emits light, it is possible to provide a low power consumption and highly efficient light emitting apparatus as compared with conventional mercury lamps.

(Phosphor)

It is preferable that the phosphor 3 is substantially uniformly contained in the resin member. In this case, it is possible to provide light with less color unevenness. The brightness, the wavelength and the like of light emitted from the light emitting apparatus 60 respond to the difference of the absolute specific gravities and the particle sizes of a plurality of types of phosphors 3 included in the light emitting apparatus 60, the uniformity of the phosphors 3 after the application, the thickness of the resin containing the phosphors, and the like. Specifically, if the amounts and the sizes of the phosphors to be excited are unevenly distributed on the path in the light emitting apparatus 60 in that the light emitted from the light emitting device 2 outgoes from the light emitting apparatus 60, color unevenness will occur. It is considered that light is mainly emitted in the particle surface of a phosphor particle. For this reason, if the mean particle diameter of a phosphor is small, the surface area per the weight of a particle can be generally ensured, and as a result it is possible to avoid brightness reduction. Also, if a phosphor particle is small, the particle is likely to reflect and diffuse light, and as a result it is possible to prevent light emission color unevenness. On the other hand, if a phosphor particle is large, it is possible to improve light conversion efficiency. Accordingly, adjustment of the amount and the particle diameter size of the phosphor allows light to efficiently outgo. In addition, in the case where the content of a phosphor is high that has with less variation in absolute specific gravity and particle diameter, color unevenness is further improved.

A phosphor with resistance to heat from the light source is preferably used as the phosphors arranged in the light emitting apparatus 60. Also, a phosphor with weather resistance to operating environment is preferably used as the phosphors. Because, generally, the luminescent intensity of a phosphor decreases with increasing temperature. The reason is that, as temperature increases, molecular collision will increase, and potential energy loss will occur due to nonradiative transition deactivation.

In the case where two or types of phosphors are includes in the sealing member 18, it is possible to emit light converted in wavelength by a first phosphor from main light emitted from the light emitting layer, and light additionally converted in wavelength by a second phosphor from the light converted in wavelength by the first phosphor. Various colors can be obtained by adjusting mixture of a plurality of types of phosphors to combine the main light source, the light converted in wavelength by the first phosphor, the light additionally converted in wavelength by the second phosphor, and light converted in wavelength by the second phosphor directly from the main light.

According to the light emitting apparatus 60 of the first embodiment, white light with excellent luminescent properties can be emitted by combination of the blue LED chip, the phosphor that is excited by the blue LED chip and can emit green light, and the phosphor that can emit red light.

(Case for Mounting Light Emitting Device.)

The case is required to be formed of a material with a high light-shielding rate to prevent leakage of light. Also, since the case includes the external terminals, the case is required to be formed of an insulating material. Specifically, exemplary materials of the case can be provided by glass epoxy laminated sheet, BT resin laminated sheet, ceramics, liquid crystal polymer, polyimide, and the like. Metal members as the external terminals are placed in metal molds, and the metal molds are filled with the aforementioned material. Thus, the case is formed by insert molding. After cooled, the case is removed from the metal molds.

(External Terminal)

The external terminals serve to electrically connect the light emitting device mounted in the case to the outside. For this reason, the external terminals preferably have excellent electrical conductivity. Specifically, exemplary materials of the external terminals can be provided by highly conductive material such as metallized member of nickel etc., phosphor bronze, iron, the copper, and the like.

(Light Reflective Material)

The light reflective material can be a film-shaped member that is formed of resin containing a reflective material. Exemplary materials of the resin can be provided by polyethylene terephthalate resin, polycarbonate resin, and polypropylene resin. Exemplary materials of the reflective member can be provided by barium titanate, aluminum oxide, silicon oxide, calcium phosphate, and the like. In addition, a metal film such as Al, Ag and Cu, can be formed on the interior or exterior surface, or both the interior and exterior surfaces of the case side wall by plating or sputtering. The light reflective material can be attached to the case side wall with silicone resin, epoxy resin, or the like.

(Die-Bonding Material)

The die-bonding material secures the light emitting device to the bottom surface of the recessed portion so that the light emitting device is arranged in the recessed portion of the case. The die-bonding material is required to have heat resistance to the extent that the properties of the die-bonding material do not deteriorate when the die-bonding material is subjected to heat generated from the light emitting device. Specifically, exemplary materials of the die-bonding material can be provided by epoxy resin, Ag-paste, eutectic crystal material, and the like.

(Conductive Member)

The conductive member is required to provide good ohmic contact, mechanical connection, electrical conductivity and heat conductivity between the conductive member and the electrodes of the light emitting device. Specifically, exemplary materials of the conductive member can be provided by metal such as gold, copper, platinum or aluminum, or an alloy of them.

(Transparent Resin)

The sealing member used to fill the case protects the light emitting device, the conductive members, and the like from external stress. The sealing member can be formed of various types of transparent resins. Specifically, exemplary materials of the sealing member can be mainly provided by excellent weather resistance transparent resin such as epoxy resin, urea resin, silicone resin, and the like. In the case where the sealing member contains a diffusion agent, the directivity of light can be reduced that emitted from the light emitting device, and as a result it is possible to increase the viewing angle. Specifically, exemplary materials of the diffusion agent can be provided by barium titanate, titanium oxide, aluminum oxide, silicon oxide, and the like.

The transparent resin can contain various types of phosphors in accordance with the light emission colors of light emitting devices to provide a light emitting apparatus emitting desired color light. In the first embodiment, silicone resin contains a mixture of phosphors that are added to the silicone resin and mixed in a predetermined ratio. The case opening is fully filled with the transparent resin containing the mixture of phosphors so that the upper surface of the transparent resin is coplanar with the upper surface of the opening on the edges.

ity of each phosphor type in the phosphor group and the mean absolute specific gravity of the phosphor types in the phosphor group falls within a range of ±16% of the mean absolute specific gravity. The content of the phosphor types in the phosphor group occupies not less than 90% by weight of the two or more types of phosphors included in the light emitting apparatus. As for the phosphor types having a similar absolute specific gravity among all the types of phosphors included in the light emitting apparatus, specifically, combinations of phosphors according to the following examples will be described that satisfy the aforementioned conditions. However, the types of phosphors and the combinations of phosphors are not limited to these examples. Needless to say, suitable phosphors can be used that satisfy the aforementioned conditions.

EXAMPLES

Examples 1 to 7, and Comparative Example 1

Nine types of phosphors are used as phosphors according to examples. Specifically, green phosphors are a halogen oxide phosphor $Ca_{7.5}MgSi_4O_{16}Cl_{2-\delta}:Eu_{0.5}$ ($0 \leq \delta \leq 1$, where $\delta$ represents composition deviation of Cl), and β-SIALON phosphors $Si_{5.775}Al_{0.21}Eu_{0.015}O_{0.023}N_{7.910}$, $SrSi_2O_2N_2:Eu$, $SrGa_2S_4:Eu$ and $Ba_3Si_6O_{12-x}N_{2+y}:Eu$. Red phosphors are a nitride phosphor $Ca_{1.94}Si_5N_8:Eu_{0.06}$, and nitride phosphors $Ca_{0.99}AlSiN_{3.005}:Eu_{0.01}$, $Ca_{0.99}AlSiB_{0.005}N_{3.005}:Eu_{0.01}$ and $(Ca,Sr)_2Si_5N_8:Eu$. A silicate phosphor $(Sr_{0.45}Ba_{0.55})_{1.93}SiO_4:Eu_{0.07}$ is used as a comparative example 1. Table 1 shows the compositions, the absolute specific gravities, the light emission peak wavelengths, and the mean particle diameters of these types of phosphors.

TABLE 1

| | Phosphor Type | Abs. Sp. Gr | Peak Wavelgth | Av. Particle Dia. |
|---|---|---|---|---|
| Green | $Ca_{7.5}MgSi_4O_{16}Cl_{2-\delta}:Eu_{0.5}$ | 3.29 | 510-530 nm | 9.8 |
| | $Si_{5.775}Al_{0.21}Eu_{0.015}O_{0.023}N_{7.910}$ | 3.23 | 530-555 nm | 8.2 |
| | $SrSi_2O_2N_2:Eu$ | 3.67 | 530-555 nm | — |
| | $SrGa_2S_4:Eu$ | 3.62 | 530-540 nm | — |
| | $Ba_3Si_6O_{12-x}N_{2+y}:Eu.$ | 4.18 | 520-540 nm | — |
| Red | $Ca_{1.94}Si_5N_8:Eu_{0.06}$ | 3.08 | 600-630 nm | 9.2 |
| | $Ca_{0.99}AlSiN_{3.005}:Eu_{0.01}$ | 3.24 | 630-670 nm | 9.7 |
| | $Ca_{0.99}AlSiB_{0.005}N_{3.005}:Eu_{0.01}$ | 3.24 | 630-670 nm | 10.4 |
| | $(Ca, Sr)_2Si_5N_8:Eu$ | 3.59 | 600-650 nm | — |
| Comp. | $(Sr_{0.45}Ba_{0.55})_{1.93}SiO_4:Eu_{0.07}$ | 5.03 | 510-570 nm | 10 |

Subsequently, the transparent resin is heated at 70° C. for three hours, and then heated at 150° C. for one hour. Thus, the light emitting apparatus is produced.

As discussed above, the light emitting apparatus according to the first embodiment includes the light emitting device, and two or more types of phosphors that are excited by light emitted from the light emitting device. Among all the types of phosphors included in the light emitting apparatus, phosphor types having a similar absolute specific gravity occupy a large majority of the total weight of all the phosphors included in the light emitting apparatus. Specifically, a phosphor group is included that consists of phosphor types having an absolute specific gravity in a range of not less than 3.00 to not more than 4.30. The difference between the absolute specific grav- The phosphors shown in Table 1 have similar absolute specific gravities. The difference d of the average value A of the absolute specific gravities of phosphors and the absolute specific gravity of each phosphor falls within a range of ±16% of the absolute specific gravity average value in any combinations. Accordingly, combinations of phosphors according to the present invention are not limited to the combinations according to the following examples. A phosphor according to each example can be substituted by a phosphor in Table 1. Also, a phosphor in Table 1 can be added to phosphors according to each example.

The following Table 2 shows the chromaticity coordinates of the phosphors and LEDs that emit light components in the light emitting apparatuses according to the following examples. FIG. 7 shows the chromaticity diagram.

TABLE 2

| | | | Chromaticity Coordinate | |
|---|---|---|---|---|
| | | | x | y |
| Blue | LED | LED-450 nm | 0.153 | 0.026 |
| | LED | LED-460 nm | 0.144 | 0.042 |
| Green | Chlorosilicate | $Ca_{7.5}MgSi_4O_{16}Cl_{2-\delta}:Eu_{0.5}$ | 0.254 | 0.664 |
| | β-SIALON | $Si_{5.775}Al_{0.21}Eu_{0.015}O_{0.023}N_{7.910}$ | 0.332 | 0.645 |
| Red | CESN | $Ca_{1.94}Si_5N_8:Eu_{0.06}$ | 0.595 | 0.399 |
| | CAS(B)N | $Ca_{0.99}AlSiB_{0.005}N_{3.005}:Eu_{0.01}$ | 0.658 | 0.336 |
| | Blend 1 | CASN + CESN = 6 + 4 | 0.624 | 0.369 |
| | Blend 2 | CASN + CESN = 8 + 2 | 0.639 | 0.353 |

FIG. 7 shows the color reproduction region that can be expressed by a blue LED, two types of red luminescent phosphors excited by the LED, and two types of green luminescent phosphors similarly excited by the blue LED. Dashed lines in this Figure show the NTSC color region. As shown in FIG. 7, the color coordinates of LEDs for blue light component are in proximity to each other. The color coordinates of the phosphors for each of red and green are located spaced away from each other. In the light emitting apparatus, the green light component is obtained by blending the green luminescent type phosphors with coordinates located spaced away from each other. The color coordinates of the green light component vary in accordance with the mixture ratio of the green luminescent type phosphors. Specifically, the color coordinates of the green light component moves between the color coordinates of the phosphors with coordinates located spaced away from each other. That is, the color coordinates of one light component can be provided by blending the phosphors with different wavelengths. In other words, the color coordinates of a mixed light component can be adjusted as desired in accordance with the mixture ratio of the phosphors. In the phosphors according to the examples, since the difference of the color coordinates of phosphors is large that emit a similar color light, blending the phosphors can provide a wide color coordinate region. Since the color coordinates of each of red and green light components can be adjusted by blending two types of phosphors, the color reproduction region configured by the respective color coordinates as vertexes of three primary light colors can be adjusted to a desired range. Accordingly, the problem can be solved in that a conventional light emitting apparatus consisting of a blue LED and a yellow phosphor does not have sufficient reproducibility in terms of the NTSC ratio. That is, according to the light emitting apparatus of the present invention, since red and green light components can be adjusted to desired coordinates by blending phosphors with color coordinates located spaced away from each other, the color reproduction region can be brought closer to NTSC (dashed line region in FIG. 7). In addition, in the case where a color filter is used together with the light emitting apparatus, since the absorptivity of the filter varies in accordance wavelength of light, the color reproduction region of filter-passing light will vary in accordance with the properties of the filter. Also, in this case, according to the light emitting apparatus of the present invention, since a light component can be emitted corresponding to the properties of the various color filters, it is possible to provide bright filter-passing light with reduced filtered light loss.

Example 1

Each light emitting apparatus according to an example 1 includes a blue luminescent type LED, and the following green luminescent type phosphor and the following red luminescent type phosphors. Specifically, a phosphor according to the example 1 is composed of one type of green luminescent phosphor, and two types of red luminescent phosphors mixed in the following weight ratio.

Green: $Si_{5.775}Al_{0.21}Eu_{0.015}O_{0.023}N_{7.910}$

Red: $Ca_{1.94}Si_5N_8:Eu_{0.06}+Ca_{0.99}AlSiB_{0.005}N_{3.005}:Eu_{0.01}$ = 2+8 in weight ratio Two types of light emitting apparatuses are produced as type (a) and type (b) in each example by using blue luminescent LEDs having peak wavelengths of 450 and 460 nm. That is, the light emitting apparatus according to the example 1(a) includes an LED having a peak wavelength of 450 nm, and the light emitting apparatus according to the example 1(b) includes an LED having a peak wavelength of 460 nm. The following Table 3 shows conditions of LED peak wavelength, and the compositions and the weight ratio of phosphors according to the examples 1(a) and 1(b). In addition, the luminescent properties of the chromaticity, the luminous intensity and the light flux of light emitted by each light emitting apparatuses are shown. FIG. 8 shows the light emission spectrum of the light emitting apparatus according to the example 1(a).

TABLE 3

| | | | Example 1 | |
|---|---|---|---|---|
| | | | (a) | (b) |
| Composition | Blue | LED | 450 nm | 460 nm |
| | Green | Phosphor 1 | — | — |
| | | Phosphor 2 | $Si_{5.775}Al_{0.21}Eu_{0.015}O_{0.023}N_{7.910}$ | |
| | Red | Phosphor 3 | $Ca_{1.94}Si_5N_8:Eu_{0.06}$ | |
| | | Phosphor 4 | $Ca_{0.99}AlSiB_{0.005}N_{3.005}:Eu_{0.01}$ | |
| Weight Ratio | | Phosphor 1 | — | — |
| | | Phosphor 2 | 85 | 83 |
| | | Phosphor 3 | 3 | 3.4 |
| | | Phosphor 4 | 12 | 13.6 |
| Property | Chromaticity | x | 0.289 | 0.294 |
| | Coordinate | y | 0.275 | 0.277 |
| | Luminous Intensity [cd] | | 1.36294 | 1.24 |
| | Luminous Flux [lm] | | 3.5 | 3.18 |

In addition, the following Table 4 shows the absolute specific gravity of each phosphor according to the example 1, the average value A of the absolute specific gravities of the phosphors according to the example 1, the difference d between the absolute specific gravity of each phosphor and the average value (d=a−A), and the ratio of the difference d to the average value A (d/A×100 [%]).

TABLE 4

| | | Example 1 | | |
| --- | --- | --- | --- | --- |
| | Abs. Sp. Gr a | Av. Abs. Sp. Gr A | Diff. Bet. Abs. Sp. Gr and Ave. d = a − A | Ratio of Diff. d to Ave. d/A × 100 [%] |
| Phosphor 1 | — | 3.18 | — | — |
| Phosphor 2 | $Si_{5.775}Al_{0.21}Eu_{0.015}O_{0.023}N_{7.910}$ | 3.23 | 0.05 | 1.57 |
| Phosphor 3 | $Ca_{1.94}Si_5N_8:Eu_{0.06}$ | 3.08 | −0.10 | −3.14 |
| Phosphor 4 | $Ca_{0.99}AlSiB_{0.005}N_{3.005}:Eu_{0.01}$ | 3.24 | 0.06 | 1.89 |

Example 2

The light emitting apparatuses according to examples 2 to 7 and the comparative example 1 have substantially the same configuration as the light emitting apparatus according to the example 1 except that the phosphor included in the light emitting apparatus according to the example 1 is substituted by phosphors shown below. Specifically, a phosphor according to the example 2 is composed of two types of green luminescent phosphors, and two types of red luminescent phosphors mixed in the following weight ratio.

Green: $Si_{5.775}Al_{0.21}Eu_{0.015}O_{0.023}N_{7.910}+Ca_{7.5}MgSi_4O_{16}Cl_{2-\delta}:Eu_{0.5}=1+1$ in weight ratio Red: $Ca_{1.94}Si_5N_8:Eu_{0.06}\ Ca_{0.99}AlSiB_{0.005}N_{3.005}:Eu_{0.01}=2+8$ in weight ratio Table 5 shows the compositions and the weight ratio of the phosphors, and the luminescent properties of the light emitting apparatus. FIG. 9 shows the light emission spectrum of an example 2(a) in LED 450 nm excitation. FIG. 10 shows the light emission spectrum of an example 2(b) in LED 460 nm excitation.

TABLE 5

| | | | Example 2 | |
| --- | --- | --- | --- | --- |
| | | | (a) | (b) |
| Composition | Blue Green | LED Phosphor 1 Phosphor 2 | 450 nm $Ca_{7.5}MgSi_4O_{16}Cl_{2-\delta}:Eu_{0.5}$ $Si_{5.775}Al_{0.21}Eu_{0.015}O_{0.023}N_{7.910}$ | 460 nm |

TABLE 5-continued

| | | Example 2 | |
| --- | --- | --- | --- |
| | | (a) | (b) |
| | Red Phosphor 3 | $Ca_{1.94}Si_5N_8:Eu_{0.06}$ | |
| | Phosphor 4 | $Ca_{0.99}AlSiB_{0.005}N_{3.005}:Eu_{0.01}$ | |
| Weight Ratio | Phosphor 1 | 36.5 | |
| | Phosphor 2 | 36.5 | |
| | Phosphor 3 | 5.4 | |
| | Phosphor 4 | 21.6 | |
| Property | Chromaticity x | 0.296 | 0.273 |
| | Coordinate y | 0.288 | 0.280 |
| | Luminous Intensity [cd] | 1.36 | 1.41 |
| | Luminous Flux [lm] | 3.56 | 3.62 |

In addition, the following Table 6 shows the absolute specific gravity of each phosphor according to the example 2, the average value A of the absolute specific gravities of the phosphors according to the example 2, the difference d between the absolute specific gravity of each phosphor and the average value (d=a−A), and the ratio of the difference d to the average value A (d/A×100 [%]).

TABLE 6

| | | Example 2 | | | |
| --- | --- | --- | --- | --- | --- |
| | | Abs. Sp. Gr a | Av. Abs. Sp. Gr A | Diff. Bet. Abs. Sp. Gr and Ave. d = a − A | Ratio of Diff. d to Ave. d/A × 100 [%] |
| Phosphor 1 | $Ca_{7.5}MgSi_4O_{16}Cl_{2-\delta}:Eu_{0.5}$ | 3.18 | 3.18 | 0.00 | 0.00 |
| Phosphor 2 | $Si_{5.775}Al_{0.21}Eu_{0.015}O_{0.023}N_{7.910}$ | 3.23 | | 0.05 | 1.57 |
| Phosphor 3 | $Ca_{1.94}Si_5N_8:Eu_{0.06}$ | 3.08 | | −0.10 | −3.14 |
| Phosphor 4 | $Ca_{0.99}AlSiB_{0.005}N_{3.005}:Eu_{0.01}$ | 3.24 | | 0.06 | 1.89 |

Example 3

A phosphor according to the example 3 is composed of one type of green luminescent phosphor, and two types of red luminescent phosphors mixed in the following weight ratio.

Green: $Ca_8MgSi_4O_{16}Cl_{2-\delta}:Eu$

Red: $Ca_{1.94}Si_5N_8:Eu_{0.06}+Ca_{0.99}AlSiB_{0.005}N_{3.005}:Eu_{0.01}=2+8$ in weight ratio Table 7 shows the compositions and the weight ratio of the phosphors, and the luminescent properties of the light emitting apparatus. FIG. 11 shows the light emission spectrum of the Example 3(a) in LED 450 nm excitation.

TABLE 7

| | | | Example 3 | |
|---|---|---|---|---|
| | | | (a) | (b) |
| Composition | Blue | LED | 450 nm | 460 nm |
| | Green | Phosphor 1 | $Ca_8MgSi_4O_{16}Cl_{2-\delta}$:$Eu_{0.5}$ | |
| | | Phosphor 2 | — | |
| | Red | Phosphor 3 | $Ca_{1.94}Si_5N_8$:$Eu_{0.06}$ | |
| | | Phosphor 4 | $Ca_{0.99}AlSiB_{0.005}N_{3.005}$:$Eu_{0.01}$ | |
| Weight Ratio | | Phosphor 1 | 70 | 67 |
| | | Phosphor 2 | — | — |
| | | Phosphor 3 | 6 | 6.6 |
| | | Phosphor 4 | 24 | 26.4 |
| Property | Chromaticity | x | 0.274 | 0.270 |
| | Coordinate | y | 0.271 | 0.284 |
| | Luminous Intensity [cd] | | 1.44 | 1.45 |
| | Luminous Flux [lm] | | 3.77 | 3.74 |

In addition, the following Table 8 shows the absolute specific gravity of each phosphor according to the example 3, the average value A of the absolute specific gravities of the phosphors according to the example 3, the difference d between the absolute specific gravity of each phosphor and the average value (d=a−A), and the ratio of the difference d to the average value A (d/A×100 [%]).

TABLE 8

| | | Example 3 | | | |
|---|---|---|---|---|---|
| | | Abs. Sp. Gr a | Av. Abs. Sp. Gr A | Diff. Bet. Abs. Sp. Gr and Ave. d = a − A | Ratio of Diff. d to Ave. d/A × 100 [%] |
| Phosphor 1 | $Ca_8MgSi_4O_{16}Cl_{2-\delta}$:$Eu_{0.5}$ | 3.18 | 3.17 | 0.01 | 0.32 |
| Phosphor 2 | — | — | | — | — |
| Phosphor 3 | $Ca_{1.94}Si_5N_8$:$Eu_{0.06}$ | 3.08 | | −0.09 | −2.84 |
| Phosphor 4 | $Ca_{0.99}AlSiB_{0.005}N_{3.005}$:$Eu_{0.01}$ | 3.24 | | 0.07 | 2.21 |

Example 4

A phosphor according to the example 4 is composed of one type of green luminescent phosphor, and two types of red luminescent phosphors mixed in the following weight ratio.

Green: $Si_{5.775}Al^{0.21}Eu_{0.015}O_{0.023}N_{7.910}$
Red: $Ca_{1.94}Si_5N_8$:$Eu_{0.06}$+$Ca_{0.99}AlSiB_{0.005}N_{3.005}$:$Eu_{0.01}$= 4+6 in weight ratio Table 9 shows the compositions and the weight ratio of the phosphors, and the luminescent properties of the light emitting apparatus. FIG. 12 shows the light emission spectrum of the Example 4(a) in LED 450 nm excitation.

TABLE 9

| | | | Example 4 | |
|---|---|---|---|---|
| | | | (a) | (b) |
| Composition | Blue | LED | 450 nm | 460 nm |
| | Green | Phosphor 1 | — | — |
| | | Phosphor 2 | $Si_{5.775}Al_{0.21}Eu_{0.015}O_{0.023}N_{7.910}$ | |
| | Red | Phosphor 3 | $Ca_{1.94}Si_5N_8$:$Eu_{0.06}$ | |
| | | Phosphor 4 | $Ca_{0.99}AlSiB_{0.005}N_{3.005}$:$Eu_{0.01}$ | |
| Weight Ratio | | Phosphor 1 | — | — |
| | | Phosphor 2 | 8.4 | 8.2 |
| | | Phosphor 3 | 6.4 | 7.2 |
| | | Phosphor 4 | 9.6 | 10.8 |
| Property | Chromaticity | x | 0.285 | 0.292 |
| | Coordinate | y | 0.251 | 0.280 |
| | Luminous Intensity [cd] | | 1.33 | 1.3 |
| | Luminous Flux [lm] | | 3.43 | 3.32 |

In addition, the following Table 10 shows the absolute specific gravity of each phosphor according to the example 4, the average value A of the absolute specific gravities of the phosphors according to the example 4, the difference d between the absolute specific gravity of each phosphor and the average value (d=a−A), and the ratio of the difference d to the average value A (d/A×100 [%]

TABLE 10

| | | Example 4 | | |
|---|---|---|---|---|
| | | Abs. Sp. Gr a | Av. Abs. Sp. Gr A | Diff. Bet. Abs. Sp. Gr and Ave. d = a − A | Ratio of Diff. d to Ave. d/A × 100 [%] |
| Phosphor 1 | — | — | 3.18 | — | — |
| Phosphor 2 | $Si_{5.775}Al_{0.21}Eu_{0.015}O_{0.023}N_{7.910}$ | 3.23 | | 0.05 | 1.57 |
| Phosphor 3 | $Ca_{1.94}Si_5N_8{:}Eu_{0.06}$ | 3.08 | | −0.10 | −3.14 |
| Phosphor 4 | $Ca_{0.99}AlSiB_{0.005}N_{3.005}{:}Eu_{0.01}$ | 3.24 | | 0.06 | 1.89 |

Example 5

A phosphor according to the example 5 is composed of one type of green luminescent phosphor, and one type of red luminescent phosphor mixed in the following weight ratio.

Green: $Ca_8MgSi_4O_{16}Cl_{2-\delta}{:}Eu$
Red: $Ca_{0.99}AlSiN_{3.005}{:}Eu_{0.01}$ Table 11 shows the compositions and the weight ratio of the phosphors, and the luminescent properties of the light emitting apparatus.

TABLE 11

| | | Example 5 | |
|---|---|---|---|
| Composition | Blue | LED | 460 nm |
| | Green | Phosphor 1 | $Ca_8MgSi_4O_{16}Cl_{2-\delta}{:}Eu_{0.5}$ |
| | | Phosphor 2 | — |
| | Red | Phosphor 3 | — |
| | | Phosphor 4 | $Ca_{0.99}AlSiN_{3.005}{:}Eu_{0.01}$ |
| Weight Ratio | | Phosphor 1 | 72 |
| | | Phosphor 2 | — |
| | | Phosphor 3 | — |
| | | Phosphor 4 | 28 |
| Property | Chromaticity | x | 0.271 |
| | Coordinate | y | 0.266 |
| | Luminous Intensity [cd] | | 1.29 |
| | Luminous Flux [lm] | | 3.16 |

In addition, the following Table 12 shows the absolute specific gravity of each phosphor according to the example 5, the average value A of the absolute specific gravities of the phosphors according to the example 5, the difference d between the absolute specific gravity of each phosphor and the average value (d=a−A), and the ratio of the difference d to the average value A (d/A×100 [%]).

TABLE 12

| | | Example 5 | | | |
|---|---|---|---|---|---|
| | | Abs. Sp. Gr a | Av. Abs. Sp. Gr A | Diff. Bet. Abs. Sp. Gr and Ave. d = a − A | Ratio of Diff. d to Ave. d/A × 100 [%] |
| Phosphor 1 | $Ca_8MgSi_4O_{16}Cl_{2-\delta}{:}Eu_{0.5}$ | 3.18 | 3.21 | −0.03 | −0.93 |
| Phosphor 2 | — | — | | — | — |
| Phosphor 3 | — | — | | — | — |
| Phosphor 4 | $Ca_{0.99}AlSiN_{3.005}{:}Eu_{0.01}$ | 3.24 | | 0.03 | 0.93 |

Example 6

A phosphor according to the example 6 is composed of one types of green luminescent phosphor, and one type of red luminescent phosphor mixed in the following weight ratio.

Green: $Si_{5.775}Al^{0.21}Eu_{0.015}O_{0.023}N_{7.910}$
Red: $Ca_{0.99}AlSiN_{3.005}{:}Eu_{0.01}$ Table 13 shows the compositions and the weight ratio of the phosphors.

TABLE 13

| | | Example 6 | |
|---|---|---|---|
| Composition | Blue | LED | 460 nm |
| | Green | Phosphor 1 | — |
| | | Phosphor 2 | $Si_{5.775}Al_{0.21}Eu_{0.015}O_{0.023}N_{7.910}$ |
| | Red | Phosphor 3 | — |
| | | Phosphor 4 | $Ca_{0.99}AlSiN_{3.005}{:}Eu_{0.01}$ |
| Weight Ratio | | Phosphor 1 | — |
| | | Phosphor 2 | 84 |
| | | Phosphor 3 | — |
| | | Phosphor 4 | 16 |

In addition, the following Table 14 shows the absolute specific gravity of each phosphor according to the example 6, the average value A of the absolute specific gravities of the phosphors according to the example 6, the difference d between the absolute specific gravity of each phosphor and the average value (d=a−A), and the ratio of the difference d to the average value A (d/A×100 [%]).

TABLE 14

| | | Example 6 | | |
|---|---|---|---|---|
| | Abs. Sp. Gr a | Av. Abs. Sp. Gr A | Diff. Bet. Abs. Sp. Gr and Ave. d = a − A | Ratio of Diff. d to Ave. d/A × 100 [%] |
| Phosphor 1 | — | 3.24 | — | — |
| Phosphor 2 | $Si_{5.775}Al_{0.21}Eu_{0.015}O_{0.023}N_{7.910}$ 3.23 | | −0.01 | −0.31 |
| Phosphor 3 | — | | — | — |
| Phosphor 4 | $Ca_{0.99}AlSiN_{3.005}:Eu_{0.01}$ 3.24 | | 0.00 | 0.00 |

Example 7

A phosphor according to the example 7 is composed of two types of green luminescent phosphor, and one type of red luminescent phosphor mixed in the following weight ratio.

Green: $Si_{5.775}Al_{0.21}Eu_{0.015}O_{0.023}N_{7.910} + Ca_{7.5}MgSi_4O_{16}Cl_{2-\delta}:Eu_{0.5}$ = 1:1 in weight ratio Red: $Ca_{0.99}AlSiN_{3.005}:Eu_{0.01}$ Table 15 shows the compositions and the weight ratio of the phosphors.

TABLE 15

| | | | Example 7 |
|---|---|---|---|
| Composition | Blue | LED | 460 nm |
| | Green | Phosphor 1 | $Ca_{7.5}MgSi_4O_{16}Cl_{2-\delta}:Eu_{0.5}$ |
| | | Phosphor 2 | $Si_{5.775}Al_{0.21}Eu_{0.015}O_{0.023}N_{7.910}$ |
| | Red | Phosphor 3 | — |
| | | Phosphor 4 | $Ca_{0.99}AlSiN_{3.005}:Eu_{0.01}$ |
| Weight Ratio | | Phosphor 1 | 36 |
| | | Phosphor 2 | 36 |
| | | Phosphor 3 | — |
| | | Phosphor 4 | 28 |

In addition, the following Table 16 shows the absolute specific gravity of each phosphor according to the example 7, the average value A of the absolute specific gravities of the phosphors according to the example 7, the difference d between the absolute specific gravity of each phosphor and the average value (d=a−A), and the ratio of the difference d to the average value A (d/A×100 [%]).

TABLE 16

| | | Example 7 | | |
|---|---|---|---|---|
| | Abs. Sp. Gr a | Av. Abs. Sp. Gr A | Diff. Bet. Abs. Sp. Gr and Ave. d = a − A | Ratio of Diff. d to Ave. d/A × 100 [%] |
| Phosphor 1 | $Ca_{7.5}MgSi_4O_{16}Cl_{2-\delta}:Eu_{0.5}$ 3.18 | 3.22 | −0.04 | −1.24 |
| Phosphor 2 | $Si_{5.775}Al_{0.21}Eu_{0.015}O_{0.023}N_{7.910}$ 3.23 | | 0.01 | 0.31 |
| Phosphor 3 | — | | — | — |
| Phosphor 4 | $Ca_{0.99}AlSiN_{3.005}:Eu_{0.01}$ 3.24 | | 0.02 | 0.62 |

Comparative Example 1

A phosphor according to the comparative example 1 is composed of one type of green luminescent phosphor, and one type of red luminescent phosphor mixed in the following weight ratio.

Green: $(Sr_{0.45}Ba_{0.55})_{1.93}SiO_4:Eu_{0.07}$

Red: $Ca_{0.99}AlSiN_{3.005}:Eu_{0.01}$

Table 17 shows the compositions and the weight ratio of the phosphors, and the luminescent properties of the light emitting apparatus.

TABLE 17

| | | | Comparative Example 3 |
|---|---|---|---|
| Composition | Blue | LED | 460 nm |
| | Green | Phosphor 1 | $(Sr_{0.45}Ba_{0.55})_{1.93}SiO_4:Eu_{0.07}$ |
| | | Phosphor 2 | — |
| | Red | Phosphor 3 | — |
| | | Phosphor 4 | $Ca_{0.99}AlSiN_{3.005}:Eu_{0.01}$ |
| Weight Ratio | | Phosphor 1 | 88 |
| | | Phosphor 2 | — |
| | | Phosphor 3 | — |
| | | Phosphor 4 | 12 |
| Property | Chromaticity Coordinate | x | 0.271 |
| | | y | 0.268 |
| | Luminous Intensity [cd] | | 1.33 |
| | Luminous Flux [lm] | | 3.28 |

In addition, the following Table 18 shows the absolute specific gravity of each phosphor according to the comparative example 1, the average value A of the absolute specific gravities of the phosphors according to the comparative example 1, the difference d between the absolute specific gravity of each phosphor and the average value (d=a−A), and the ratio of the difference d to the average value A (d/A×100 [%]).

TABLE 18

| | | Abs. Sp. Gr a | Av. Abs. Sp. Gr A | Diff. Bet. Abs. Sp. Gr and Ave. d = a − A | Ratio of Diff. d to Ave. d/A × 100 [%] |
|---|---|---|---|---|---|
| | | Comparative Example 6 | | | |
| Phosphor 1 | $(Sr_{0.45}Ba_{0.55})_{1.93}SiO_4:Eu_{0.07}$ | 5.03 | 4.14 | 0.89 | 21.50 |
| Phosphor 2 | — | — | | — | — |
| Phosphor 3 | — | — | | — | — |
| Phosphor 4 | $Ca_{0.99}AlSiN_{3.005}:Eu_{0.01}$ | 3.24 | | −0.90 | −21.74 |

FIG. 13 shows a cross-sectional schematic view of a part of the light emitting apparatus according to the foregoing examples in proximity to the light emitting device. FIG. 13 shows the light emitting apparatus with a plurality of types of mixed phosphors 3a, 3b and 3c being uniformly distributed and segmenting in proximity to the light emitting device. Specifically, phosphors 3a, 3b and 3c represent green, first red and second red phosphors, respectively. This is an effect obtained by mixing the phosphors having similar absolute specific gravities or particle diameters. That is, since the inclusion parts of the phosphors are not unevenly distributed but are substantially uniformly mixed, it is possible to effectively diffuse secondary light components excited by primary light from the light emitting device 2. That is, it is possible to provide light emission with greatly-reduced color unevenness. FIG. 13 shows the phosphors according to the example 3, i.e., $Ca_8MgSi_4O_{16}Cl_{2-\delta}:Eu$ (phosphor 3a), $Ca_{1.94}Si_5N_8:Eu_{0.06}$ (phosphor 3b), $Ca_{0.99}AlSiB_{0.0005}N_{3.005}:Eu_{0.01}$ (phosphor 3c). The average value A of the absolute specific gravities of these phosphors is 3.17. The values in the ratio of the differences d between the absolute specific gravity of each phosphor and the average value to the average value A are 0.32%, −2.84%, and 2.21%.

FIG. 14 shows a cross-sectional schematic view of the light emitting apparatus according to the foregoing comparative example 1. That is, the light emitting apparatus according to the foregoing comparative example 1 includes a plurality of types of phosphors 3c and 3d, specifically includes $(Sr_{0.45}Ba_{0.55})_{1.93}SiO_4:Eu_{0.07}$ (phosphor 3d) and $Ca_{0.99}AlSiN_{3.005}:Eu_{0.01}$ (phosphor 3c). The average value A of the absolute specific gravities of these phosphors is 4.14. The values in the ratio of the differences d between the absolute specific gravity of each phosphor and the average value to the average value A are 21.5%, and −21.74%. That is, these values do not satisfy the condition of d≦|0.16 A|. In the light emitting apparatus shown in FIG. 14, the phosphor 3d with a larger specific gravity be deposited on the side in proximity to the device, and the phosphor 3c is deposited above the phosphor 3d. That is, the phosphors are not substantially uniformly distributed but are layered. Accordingly, light components are not uniformly mixed. As a result, color unevenness appears in the light emission on the light emission viewing plane.

FIGS. 8 to 12 are light emission wavelength graphs of the light emitting apparatuses according to the examples. According to the light emission wavelength graphs, the light emitting apparatuses according to the examples has a first peak wavelength in a range of not less than 440 and not more than 470 nm, a second peak wavelength in a range of not less than 510 and not more than 550 nm, and a third peak wavelength in a range of not less than 630 and not more than 670 nm. FIG. 15 is a plot of the chromaticity coordinates of outgoing light from 10000 or more light emitting apparatuses that are produced according to the foregoing example 3b. FIG. 16 is a similar plot of the chromaticity coordinates of the light emitting apparatuses according to the comparative example 1. In these Figures, narrower or smaller plotted region shows smaller luminescent property difference among the apparatuses, and smaller color variation. In comparison between plots of FIGS. 15 and 16, dots of the light emitting apparatus according to the example 3b are densely positioned close to each other. That is, it is found that the properties of the apparatuses are substantially uniform. Therefore, even in the case where a wide reproduction area is configured of point-source lights of the light emitting apparatuses according to the example 3b, it is possible to provide surface light emission with reduced color unevenness. In contrast to this, in the light emitting apparatuses according to the comparative example 1 shown in FIG. 16, the chromaticity difference among the apparatuses is large. For this reason, the yield of such a product will be poor.

FIG. 17 shows the light emission spectrum of a light emitting apparatus that consists of a blue luminescent LED and a phosphor such as YAG (yttrium aluminum garnet) phosphor, and mixes two light components of a light component from the blue luminescent LED and a light component from the phosphor. In the case where a light emitting apparatus is used as a liquid crystal back light, after light emitted from the light emitting apparatus passes through a color filter, blue, green and red light components are provided. The NTSC ratio of the liquid crystal back light is obtained by determining a color reproduction area based on the chromaticity coordinates of the light components. In comparison for obtaining NTSC ratios, a typical color filter is used that provides an NTSC ratio of about 70% in a light emitting apparatus including a YAG: Ce phosphor. FIGS. 18 and 19 show the NTSC ratios of the two color mixture light emitting apparatuses shown in FIG. 17. FIG. 18 shows the NTSC ratio of the light emitting apparatus in LED 450 nm excitation. FIG. 19 shows the NTSC ratio of the light emitting apparatus in LED 460 nm excitation. Specifically, the NTSC ratios in FIGS. 18 and 19 are 72.4% and 72.9%, respectively.

FIGS. 20 to 23 show the NTSC ratios as luminescent properties of the light emitting apparatuses according to the examples 1 to 4 including an LED with a peak wavelength of 450 nm (example 1(a), example 2(a), example 3(a), and example 4(a)). The chromaticity regions of the light emitting apparatuses are shown in FIGS. 20 to 23 by EXPL1a, EXPL2a, EXPL3a, and EXPL4a. Also, FIGS. 24 to 27 show the NTSC ratios of the light emitting apparatuses including an LED with a peak wavelength of 460 nm (example 1(b), example 2(b), example 3(b), and example 4(b)). The chromaticity regions of the light emitting apparatuses are shown in FIGS. 24 to 27 by EXPL1b, EXPL2b, EXPL3b, and EXPL4b. In luminescent properties shown in FIGS. 20 to 27, light emitted from the light emitting apparatuses provides NTSC ratios (x, y) in a range of 78.7 to 83.6%. Therefore, it is found that the light emitting apparatuses have excellent reproduction as a luminescent property. That is, when used as back lights of monitor, digital camera, printer and the like, the light emitting apparatuses according to the examples can deeply and vividly represent RGB colors in theses devices.

The following Table 19 shows the NTSC ratio values of the aforementioned two color mixture light emitting apparatus, and three wavelength light emitting apparatuses.

TABLE 19

|           | (a) LED 450 nm | (b) LED 460 nm |
|-----------|----------------|----------------|
| Example 1 | 82.3%          | 80.7%          |
| Example 1 | 83.6%          | 81.6%          |
| Example 1 | 83.2%          | 81.8%          |
| Example 1 | 80.3%          | 78.7%          |
| YAG:Ce    | 72.9%          | 72.4%          |

Table 19 shows that the NTSC ratios of the light emitting apparatuses according to the examples (see FIGS. 20 to 27) are improved about 5% to 10% as compared with the two color mixture light emitting apparatus.

Examples 8 to 12

A phosphor according to an example 8 includes a mixture of $Ca_{7.5}MgSi_4O_{16}Cl_{2-\delta}:Eu_{0.5}$ having a peak wavelength of 522 nm, and $Si_{5.775}Al_{0.21}Eu_{0.015}O_{0.023}N_{7.910}$ having a peak wavelength of 540 more types of green luminescent type phosphors that can be used for a light emitting apparatus according to the present invention. The content of $Si_{5.775}Al_{0.21}Eu_{0.015}O_{0.023}N_{7.910}$ in the mixture of green luminescent type phosphor is 30% by weight. Phosphors according to the examples 9 to 12 are a phosphor similar to the phosphor according to the example 8 except that the contents of $Si_{5.775}Al_{0.21}Eu_{0.015}O_{0.023}N_{7.910}$ are 40%, 50%, 60% and 70% by weight. In the case where the content of $Si_{5.775}Al_{0.21}Eu_{0.015}O_{0.023}N_{7.910}$ falls within a range of these values, the peak wavelength of the two types of green luminescent type phosphors falls within a range of not less than 529 and not more than 535 nm. The peak wavelengths of phosphors according to the examples 8 to 12 are measured by exciting the two types of green luminescent type phosphors by using a light emitting device that emits light of 460 nm. Table 20 shows the measured peak wavelength together with chromaticity coordinates, half-value width, and brightness. The brightness in Table 20 is represented by a relative value of each phosphor consisting of the two types of green luminescent type phosphors relative to the brightness of $Y_3Al_5O_{12}:Ce$ in excitation by a the light emitting device that emits light of 460 nm. The brightness of $Y_3Al_5O_{12}:Ce$ is defined as 100%. FIG. 32 shows the light emission spectrum of the phosphors according to the examples 8 to 12. In FIG. 32, the light emission spectra of the phosphors according to the examples 8 to 12 by 460 nm excitation are shown by EXPL8, EXPL9, EXPL10, EXPL11, and EXPL12.

TABLE 20

|            | βSIALON Cont. | Chromatic Coordinate | | Peak Wave | ½ Value | Brightness |
|------------|---------------|------|------|-----------|---------|------------|
|            | (wt %)        | x    | y    | Lgth (nm) | Wdt (nm) | (%)       |
| Example 8  | 30            | 0.273 | 0.655 | 529      | 67      | 128.1      |
| Example 9  | 40            | 0.280 | 0.653 | 530      | 66      | 124.7      |
| Example 10 | 50            | 0.287 | 0.652 | 534      | 64      | 118.6      |
| Example 11 | 60            | 0.293 | 0.631 | 534      | 63      | 115.2      |
| Example 12 | 70            | 0.301 | 0.649 | 535      | 61      | 108.8      |

As shown in Table 20, the brightness of all the phosphors according to the examples 8 to 12 is not less than 100%. Accordingly, it can be said that the phosphors according to the examples 8 to 12 are a high-brightness phosphor. In the case where the two types of green luminescent type phosphors are mixed, the two types of green luminescent type phosphors serve as a high-brightness green luminescent type phosphor that has high brightness and a peak wavelength in a range of not less than 529 and not more than 535 nm.

Comparative Examples 2 to 3

A phosphor according to a comparative example 2 only consists of a green luminescent type phosphor $Ca_{7.2}MgSi_4O_{16}Cl_{2-\delta}:Eu_{0.8}$. A phosphor according to a comparative example 3 only consists of a green luminescent type phosphor $Ca_{7.1}MgSi_4O_{16}Cl_{2-\delta}:Eu_{0.9}$. The phosphors according to the comparative examples 2 and 3 have a composition similar to composition $Ca_{7.5}MgSi_4O_{16}Cl_{2-\delta}:Eu_{0.5}$ used in the examples 8 to 12, but have an increased amount of Eu so that the phosphors according to the comparative examples 2 and 3 have a longer peak wavelength than the peak wavelength 522 nm of composition $Ca_{7.5}MgSi_4O_{16}Cl_{2-\delta}:Eu_{0.5}$. A phosphor $Ca_{7.5}MgSi_4O_{16}Cl_{2-\delta}:Eu_{0.5}$ is a preferable form of halogen oxide phosphor according to the present invention. However, the phosphor $Ca_{7.5}MgSi_4O_{16}Cl_{2-\delta}:Eu_{0.5}$ is likely to remarkably decrease in brightness if the composition of this phosphor is adjusted to vary the peak wavelength of this phosphor.

Comparative Examples 4 to 5

A phosphor according to a comparative example 4 only consists of a green luminescent type phosphor $Si_{5.92}Al_{0.07}Eu_{0.01}O_{0.015}N_{7.96}$. A phosphor according to a comparative example 5 only consists of a green luminescent type phosphor $Si_{5.88}Al_{0.11}Eu_{0.01}O_{0.015}N_{7.95}$. The phosphors according to the comparative examples 4 and 5 have a composition similar to composition $Si_{5.775}Al_{0.21}Eu_{0.015}O_{0.023}N_{7.910}$ used in the examples 8 to 12, but have adjusted composition mixture ratios so that the phosphors according to the comparative examples 4 and 5 have a shorter peak wavelength than the peak wavelength 540 nm of composition $Si_{5.775}Al_{0.21}Eu_{0.015}O_{0.023}N_{7.910}$. A phosphor $Si_{5.775}Al_{0.21}Eu_{0.015}O_{0.023}N_{7.910}$ is a preferable form of β-SIALON phosphor according to the present invention. However, the phosphor $Si_{5.775}Al_{0.21}Eu_{0.015}O_{0.023}N_{7.910}$ is likely to remarkably decrease in brightness if the composition of this phosphor is adjusted to vary the peak wavelength of this phosphor.

The peak wavelengths of phosphors according to the comparative examples 2 to 5 are measured by exciting the green luminescent type phosphors according to the comparative examples 2 to 5 by using a light emitting device that emits light of 460 nm. Table 21 shows the measured peak wavelength together with composition, chromaticity coordinates, and brightness. The brightness in Table 21 is represented by a relative value of each phosphor relative to the brightness of $Y_3Al_5O_{12}:Ce$ in excitation by a the light emitting device that emits light of 460 nm. The brightness of $Y_3Al_5O_{12}:Ce$ is defined as 100%.

TABLE 21

| | Composition | Chromatic Coordinate x | Chromatic Coordinate y | Peak Wave Lgth (nm) | Brightness (%) |
|---|---|---|---|---|---|
| Comp. Ex. 2 | $Ca_{7.2}MgSi_4O_{16}Cl_{2-\delta}$:$Eu_{0.8}$ | 0.289 | 0.652 | 529 | 103.7 |
| Comp. Ex. 3 | $Ca_{7.1}MgSi_4O_{16}Cl_{2-\delta}$:$Eu_{0.9}$ | 0.296 | 0.648 | 530 | 95.7 |
| Comp. Ex. 4 | $Si_{5.92}Al_{0.07}Eu_{0.01}O_{0.015}N_{7.96}$ | 0.293 | 0.669 | 530 | 27.7 |
| Comp. Ex. 5 | $Si_{5.88}Al_{0.11}Eu_{0.01}O_{0.015}N_{7.95}$ | 0.314 | 0.656 | 535 | 31.2 |

Table 21 shows that the comparative example 2 has a peak wavelength of 529 nm. However, the brightness of the phosphor according to the comparative example 2 is very low as compared with the phosphor according to the example 8 having a peak wavelength of 529 nm. Although the phosphors according to the comparative examples 3 and 4 have a peak wavelength of 530 nm, the brightness of the phosphors according to the comparative examples 3 and 4 is very low as compared with the phosphor according to the example 9 similarly having a peak wavelength of 530 nm. Also, although the phosphor according to the comparative example 5 has a peak wavelength of 535 nm, the brightness of the phosphor according to the comparative example 5 is very low as compared with the phosphor according to the example 12 having the same peak wavelength. Note that, even if the phosphors according to the examples 8 to 12 and the comparative examples 2 to 5 have the same peak wavelength in their light emission spectra, when they have different half-value width or the like, their chromaticity coordinates do not always agree with each other. The chromaticity coordinates depend on the shape of a light emission spectrum. However, in the case where phosphors have the same peak wavelength corresponding to the highest energy in their light emission spectra, they will have similar luminescent colors to each other.

In the light emitting apparatuses of the foregoing examples, the weight of the green luminescent type phosphor is not less than 60% of and not more than 95% of the total weight of the phosphor, and/or the weight ratio of the red luminescent type phosphor is not less than 5% and not more than 40% of the total weight of the phosphor.

In other words, according to a light emitting apparatus of the first embodiment, the wavelength region of one of colors can be adjusted by varying the mixture ratio of a plurality of types of phosphors that compose the one of colors. As a result, it is possible to control the color reproduction of light emitted by a light emitting apparatus. Consequently, it is possible to provide a light emitting apparatus that can emit light with a wavelength suitable for a final product form composed of the apparatus. For example, in the case where a light emitting apparatus of the first embodiment is used together with a color filter that passes light having only a predetermined wavelength, since the apparatus can highly efficiently emit a light component having a wavelength corresponding to an effective wavelength range, it is possible to provide natural and fine image representation. Also, light emission wavelengths corresponding to green and red can be adjusted in accordance with wavelength range variation of a light emitting device caused by variation of applied electric power, and the like. Also, in the case where a phosphor is blended that has high luminosity in a wavelength range corresponding to lower brightness than other wavelength range, it is possible to maintain both brightness and chromaticity. That is, since the ratio of light components that compose white light can be flexibly varied and controlled in consideration of the properties of phosphors, light having a wavelength in a predetermined range can be easily provided as compared with the case where the composition of a phosphor is newly varied to produce a new phosphor.

Second Embodiment

FIG. 28(a) shows a perspective view of a light emitting apparatus 40 according to a second embodiment of the present invention. FIG. 28(b) is a cross-sectional view of the semiconductor light emitting apparatus 40 of FIG. 28(a) taken along the line XXVIIIB-XXVIIIB'. The semiconductor light emitting apparatus 40 according to the fourth embodiment is now schematically described with reference to FIGS. 28(a) and 28(b). The semiconductor light emitting apparatus 40 is provided with a package 12 that is mounted on lead frames 4. The package 12 has space that is formed in a substantially recessed shape and opens upward. In addition, a plurality of light emitting devices 2 are mounted on an exposed part of the lead frames 4 inside the space of the package 12. That is, the package 12 serves as a case body that surrounds the light emitting devices 2. Additionally, a protection element 13 such as Zener diode is also mounted inside the opening space of the package. The protection element 13 provides electrical conduction when a voltage higher than a regulation voltage is applied. Also, the light emitting devices 2 are electrically connected to the lead frames 4 through bonding wire lines 5, bumps or the like. Besides, the opening space of the package 12 is filled with a sealing resin member 6.

FIG. 28(b) shows a phosphor 3 contained in the package 12 (phosphor 3 is not shown in FIG. 28(a)). The aforementioned phosphors can be used as this phosphor 3. The phosphor 3 is includes in the resin member 6 similarly the first embodiment.

Third Embodiment

FIG. 29 shows a bullet-type light emitting apparatus 1 according to an embodiment 3. The light emitting apparatus 1 includes lead frames 4, a light emitting device 2, and a phosphor 3. The lead frames 4 are formed of a conductive member. A recessed cup portion 10 is formed in one of the lead frame 4. The light emitting device 2 is mounted in the recessed cup portion 10. The phosphor 3 converts at least part of light emitted from the light emitting device 2 in wavelength. Similar to the second embodiment, the light emitting apparatus 1 according to an embodiment 3 can include the phosphor according to the first embodiment. The light emitting device 2 has a light emission peak wavelength of about 360 to 480 nm, preferably of 445 to 470 nm. Positive and negative electrodes 9 formed on the light emitting device 2 are electrically connected to the lead frames 4 via conductive bonding wire lines 5. A bullet-shaped mold member 11 covers the light emitting device 2, the lead frames 4, and the bonding wire lines 5 with lead frame terminal portions 4a (parts of the lead frames 4) protruding. The mold member 11 is filled with a transparent resin member 6. The resin member 6 contains the phosphor 3. The resin member 6 is preferably formed of a silicone resin composition such as silicone group resin having siloxane bonding in simple molecule, and fluorocarbon resin of siloxane skeleton. In this case, it is possible to provide a sealing resin member that has excellent light resistance and heat resistance. Also, the resin member 6 can be formed of a transparent insulating resin such as epoxy resin composition and acrylic resin composition. When electric power is supplied from an external power supply to the lead frame terminals 4a, which protrude from the resin member 6, light is emitted from a light emitting layer 8 contained in a layered structure of the light emitting device 2. The peak wavelength of light emitted from the light emitting layer 8 has a light emission spectrum from ultraviolet to blue of about not more than 500 nm. The phosphor 3 is excited by a part of the emitted light. Thus, light is provided that has a different wavelength from the wavelength of the main source light from the light emitting layer 8.

Fourth Embodiment

FIG. 30 shows a light emitting apparatus 20 according to a fourth embodiment of the present invention. The components of the light emitting apparatus 20 same as those of the light emitting device 1 according to the third embodiment are attached with the same reference numerals, and their description is omitted. In the light emitting apparatus 20, the recessed cup portion 10 is formed in one of the lead frame 4, and only the recessed cup portion is filled with the resin member 6 containing the aforementioned phosphor 3. The resin member 6 inside the mold member 11 but outside the cup portion 10 does not contain the phosphor 3. The resin member with the phosphor 3 and the resin member without the phosphor are preferably formed of the same resin material. However, they may be formed of different materials. In the case where they may be formed of different materials, they can have different consistency by using the difference between temperatures required to cure the different resin materials.

In the light emitting apparatus 20, since the light emitting device 2 is mounted in substantially the central part of the bottom surface of the opening of the cup portion 10, the light emitting device 2 is embedded in the resin member 6 containing the phosphor 3. In order that the light from the light emitting layer 8 can be uniformly converted in wavelength by the phosphor 3, the light from the light emitting device is required to uniformly pass the resin member containing the phosphor. That is, it is only required that, as for the resin member containing the phosphor through which the light from the light emitting layer 8 passes, the resin member has a uniform thickness. For this reason, it is only required that the size of the cup portion 10 and the mount position of the light emitting device 2 are determined to provide uniform distance from the periphery of the light emitting device 2 to the wall surface or the top of the cup portion 10. According to the thus-configured light emitting apparatus 20, adjustment can be easy to provide uniform thickness of the resin member 6 containing the phosphor 3.

Fifth Embodiment

FIG. 31 shows a cap type light emitting apparatus 30 as a light emitting apparatus according to a fifth embodiment of the present invention. The light emitting apparatus 30 is configured to cover the surface of the mold member 11 of the light emitting apparatus 20 according to the second embodiment 2 with a cap 31 that is composed of a transparent resin member with a distributed phosphor 3.

In the cap 31, the phosphor 3a is uniformly distributed in the transparent resin member 6a. The transparent resin member 6a containing the phosphor 3a is formed in a shape that fits the exterior surface shape of the mold member 11 of the light emitting apparatus 30. Alternatively, the light emitting apparatus 30 can be produced by placing a light emitting apparatus into a predetermined mold after the transparent resin member 61 containing the phosphor is placed in this mold. Specifically, exemplary materials of the resin member 6a of the cap 31 can be provided by a transparent resin with excellent temperature properties and weather resistance such as epoxy resin, urea resin and silicone resin, silica gel, glass, inorganic binder, and the like. In addition to the aforementioned materials, thermosetting resins such as melamine resin and phenol resin also can be used. Additionally, thermoplastic resins such as polyethylene, polypropylene, polyvinyl chloride and polystyrene, and thermoplastic rubber such as styrene-butadiene block copolymer and segmented polyurethane also can be used. Furthermore, the transparent resin member can include a diffusion agent, barium titanate, titanium oxide, aluminum oxide, and the like together with the phosphor. In addition, the transparent resin member may include a light stabilizer agent, and a coloring agent. The phosphor 3a used in the cap 31 can include not only one type of phosphor but also a plurality of types of phosphors. Also, a layered phosphor structure can be used as the phosphor 3a.

In the light emitting apparatus 30, although only the resin member 6a of the cap 31 may be contain the phosphor 3a, in addition to this, the cup portion 10 can be filled with the resin member 6 containing the phosphor 3. The phosphors 3 and 3a can be the same phosphor. Also, each of the resin members 6 and 6a can contain a plurality of types of phosphors. Accordingly, it is possible to provide various types of light emission colors. An exemplary light emitting apparatus can be given that emits white light. Light emitted from the light emitting device 2 excites the phosphor 3 so that the phosphor 3 emits a light component in a range of blue to green and a light component in a range of yellow to red. A part of light emitted from this phosphor 3 excites the phosphor 3a in the cap 31 so that the phosphor 3a emits a light component in a range of green to yellow. After passing the surface of the cap 31, light components from the phosphors are mixed so that white range light is emitted. The included phosphor can be various types of phosphors similar to the first embodiment.

INDUSTRIAL APPLICABILITY

A light emitting apparatus according to the present invention can be applied to vacuum fluorescent display, display, PDP, CRT, FL, FED, projector tube and the like, in particular, white lightning source, LED display, back light source, signal light, illuminated switch, various sensors, various indicators and the like that have a light source of a blue or ultraviolet light emitting diode with excellent luminescent properties. Also, a light emitting apparatus according to the present invention can be applied to a back light for monitor, digital camera and printer required to deeply and vividly represent each of RGB colors.

Figure 1:
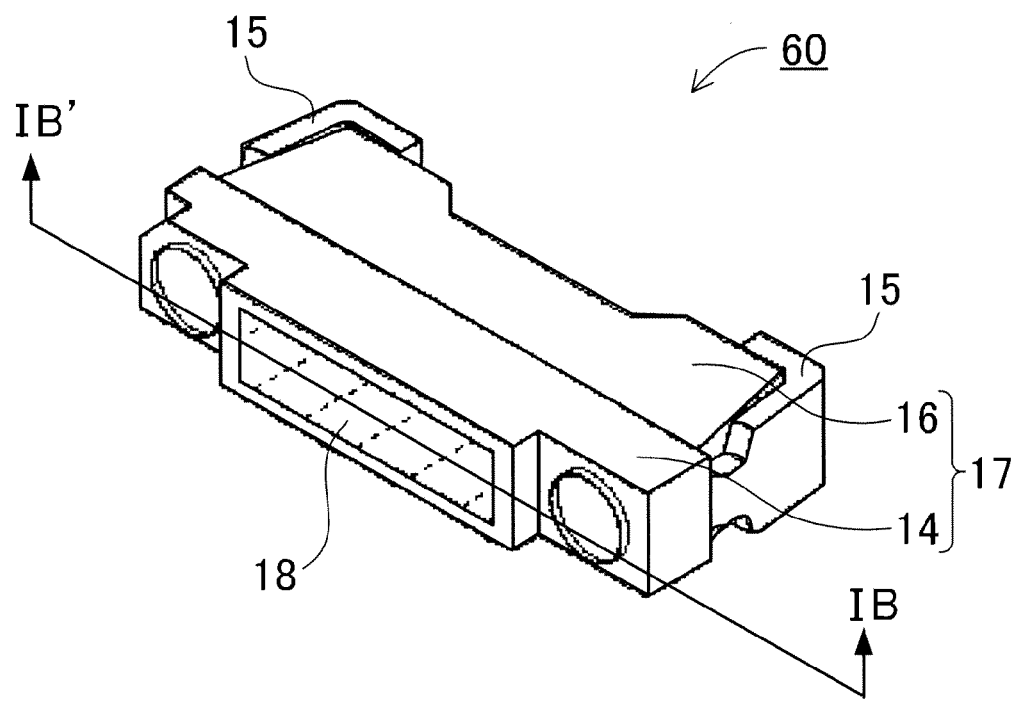
FIG. 1(a) is a perspective view showing a light emitting apparatus according to a first embodiment.
FIG. 1(b) is a cross-sectional view showing the light emitting apparatus shown in FIG. 1(a) taken along the line IB-IB'.
Figure 1:
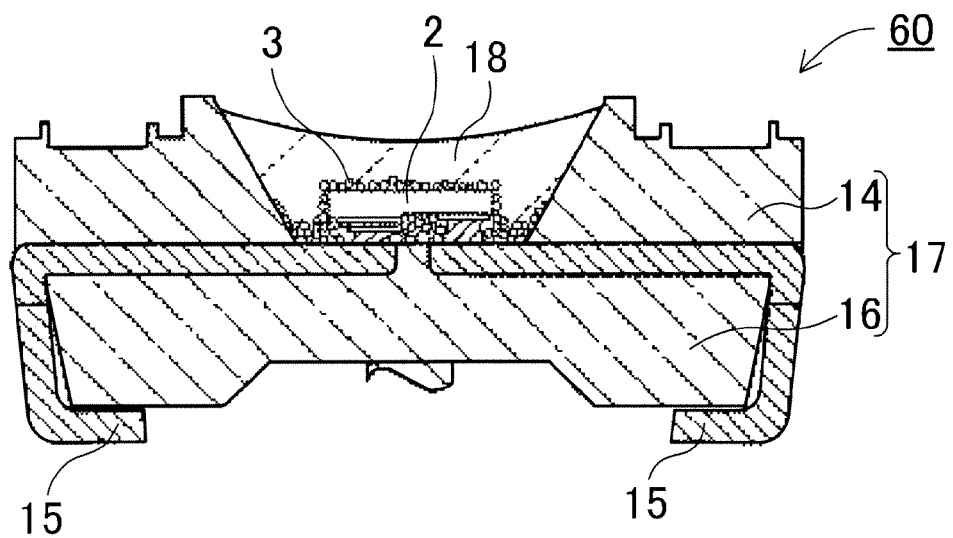
Figure 2:
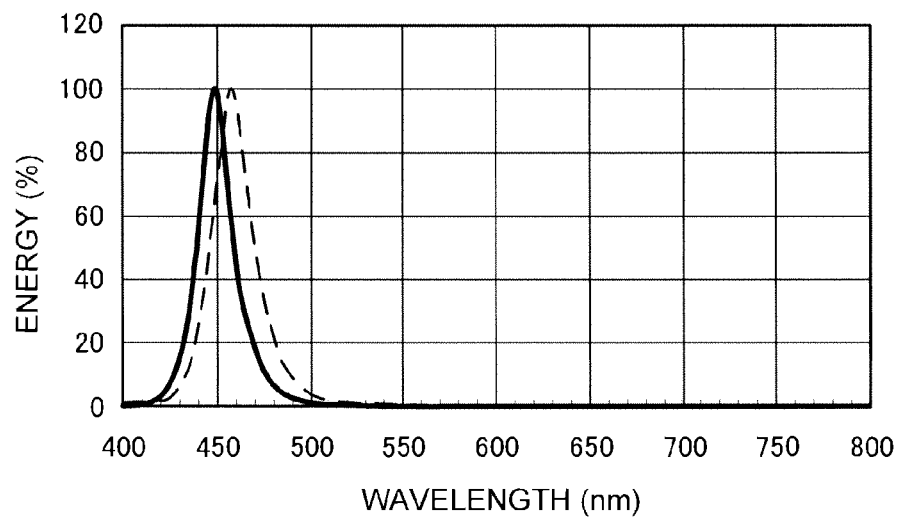
FIG. 2 is a graph showing the light emission spectra of blue LEDs.
Figure 3:
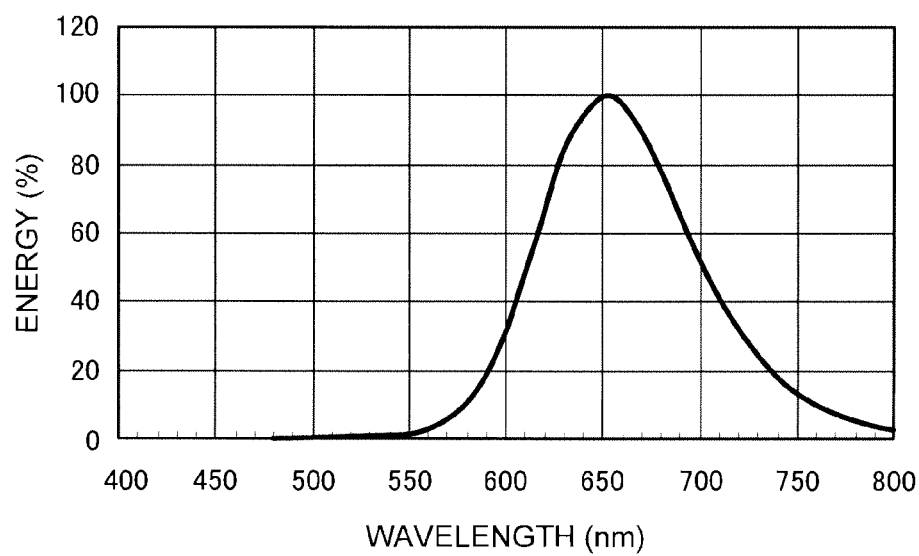
FIG. 3 shows the light emission spectrum of $CaAlSiB_y N_{3+y}$:Eu:Eu phosphor.
Figure 4:
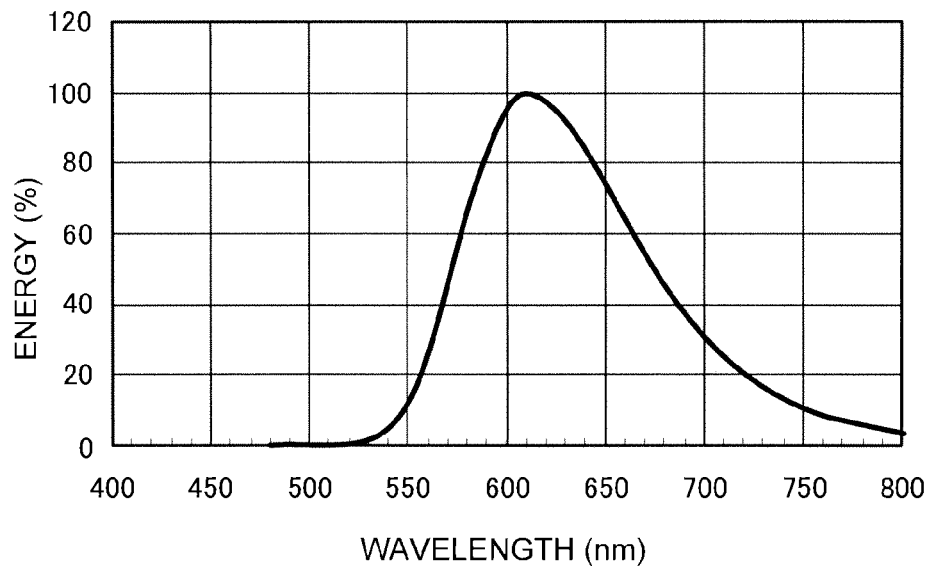
FIG. 4 shows the light emission spectrum of $Ca_2Si_5N_8$:Eu phosphor.
Figure 5:
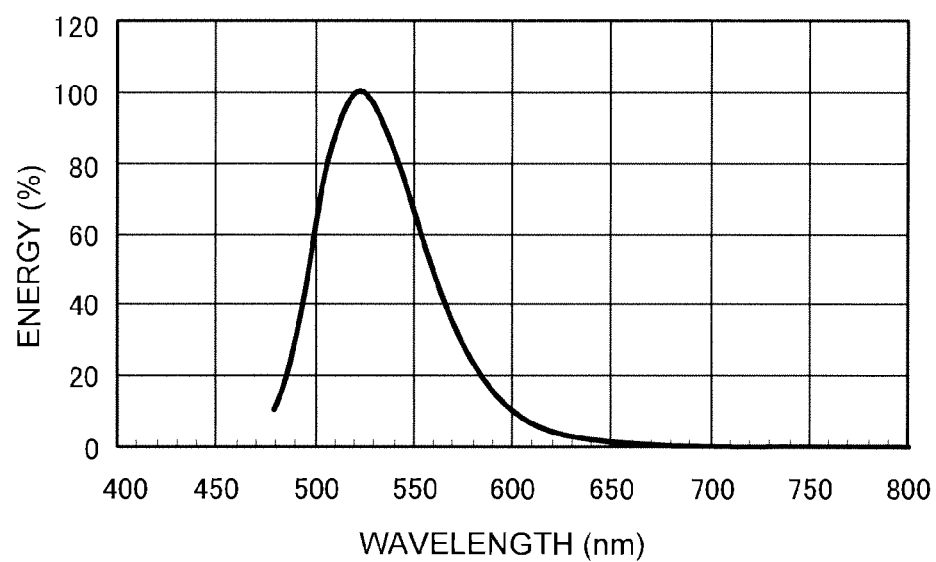
FIG. 5 shows the light emission spectrum of $Ca_8MgSi_4O_{16}Cl_{2-\delta}$:Eu phosphor.
Figure 6:
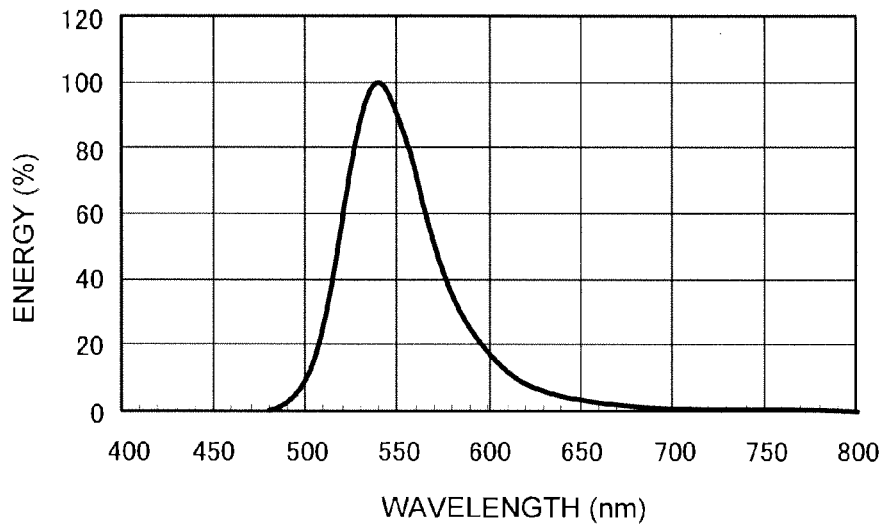
FIG. 6 shows the light emission spectrum of $Si_{6-x}Al_xO_y N_{8-y}$:Eu phosphor.
Figure 7:
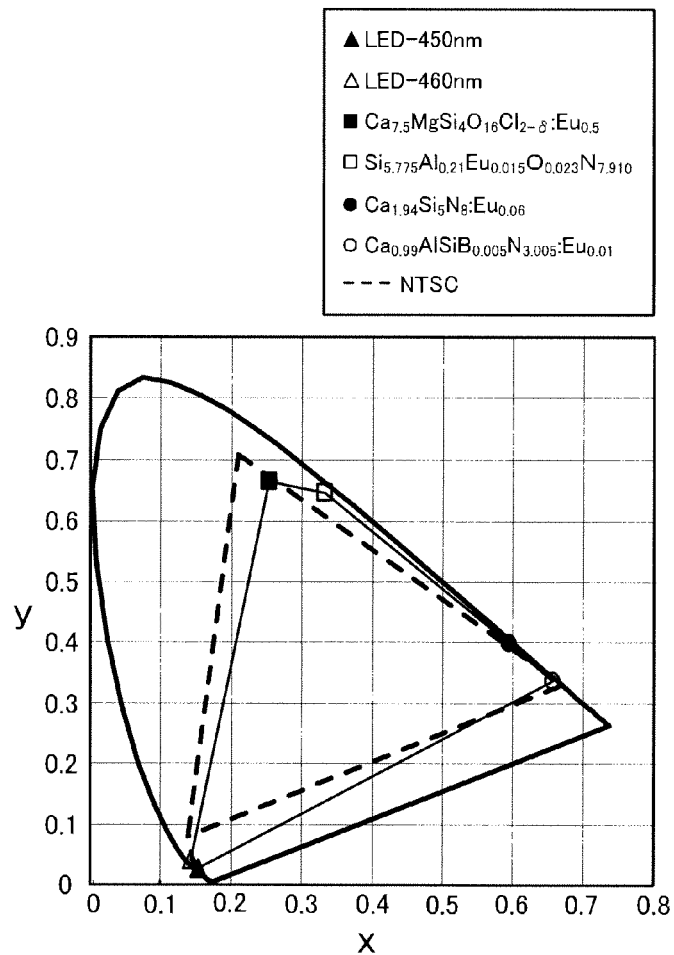
FIG. 7 shows the chromaticity coordinates of phosphors and LEDs in the chromaticity diagram.
Figure 8:
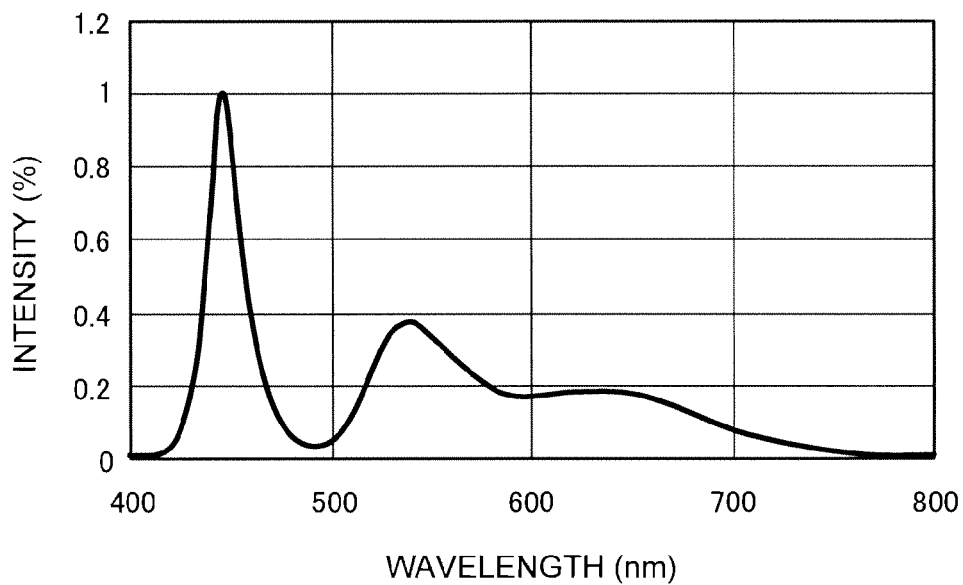
FIG. 8 is a graph showing the light emission spectrum of a light emitting apparatus according to an example 1.
Figure 9:
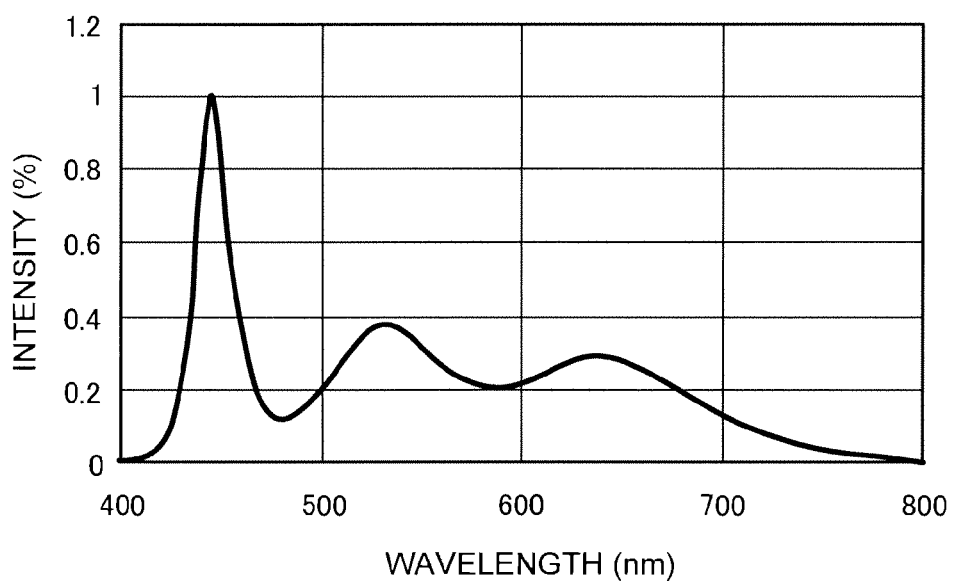
FIG. 9 is a graph showing the light emission spectrum of a light emitting apparatus according to an example 2 (blue 450 nm excitation).
Figure 10:
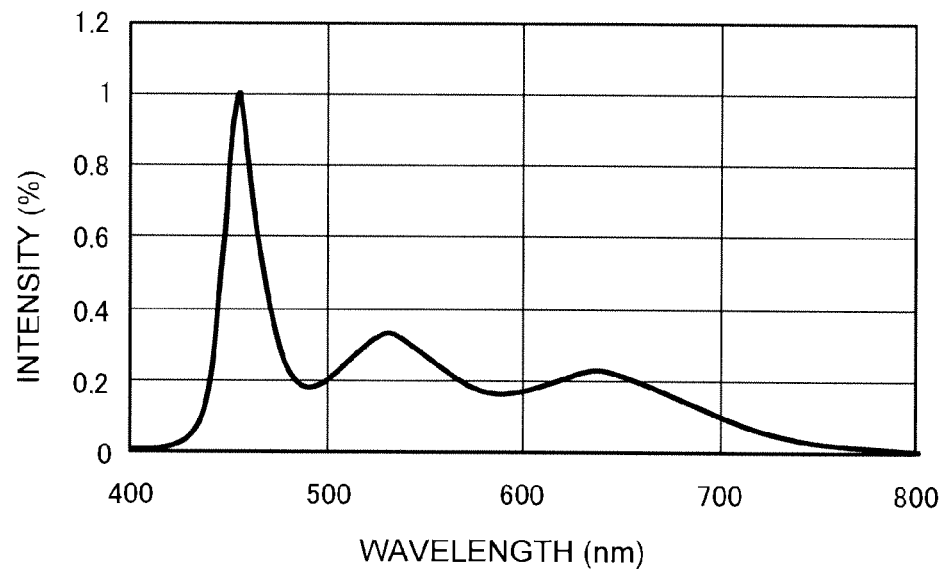
FIG. 10 is a graph showing the light emission spectrum of a light emitting apparatus according to the example 2 (blue 460 nm excitation).
Figure 11:
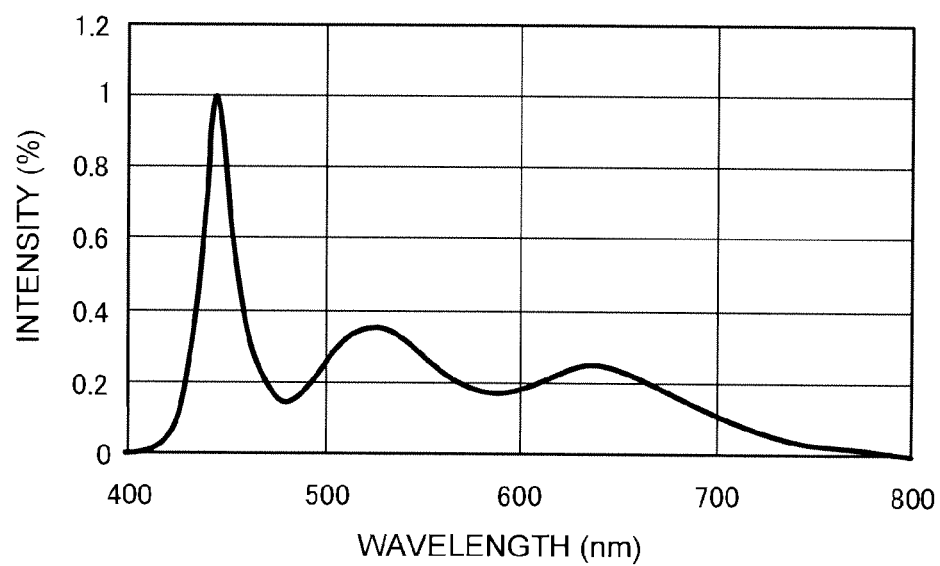
FIG. 11 is a graph showing the light emission spectrum of a light emitting apparatus according to an example 3.
Figure 12:
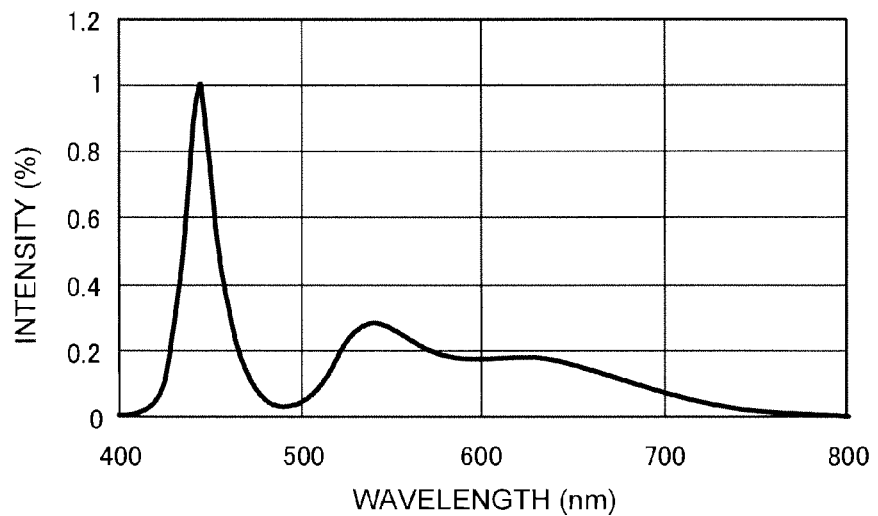
FIG. 12 is a graph showing the light emission spectrum of a light emitting apparatus according to an example 4.
Figure 13:
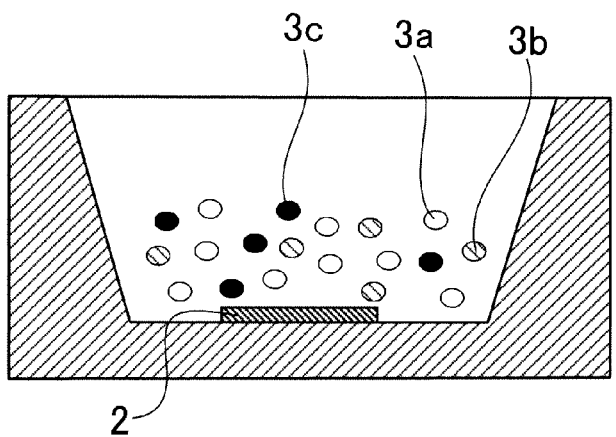
FIG. 13 is a conceptual view of sedimentation of a phosphor in the first embodiment.
Figure 14:
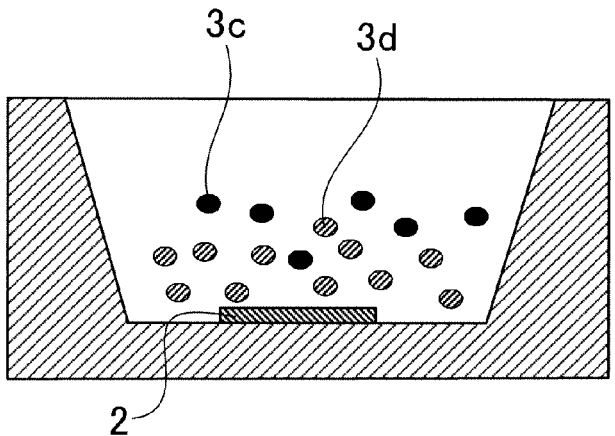
FIG. 14 is a conceptual view of sedimentation of a phosphor in a comparative example 1.
Figure 15:
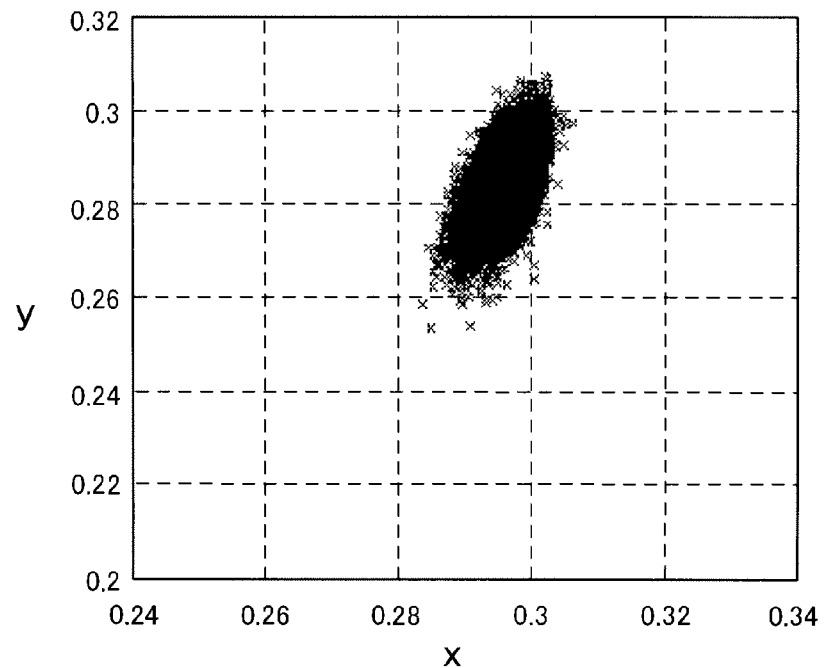
FIG. 15 is a graph showing color variation of light emitting apparatuses according to an example 3b.
Figure 16:
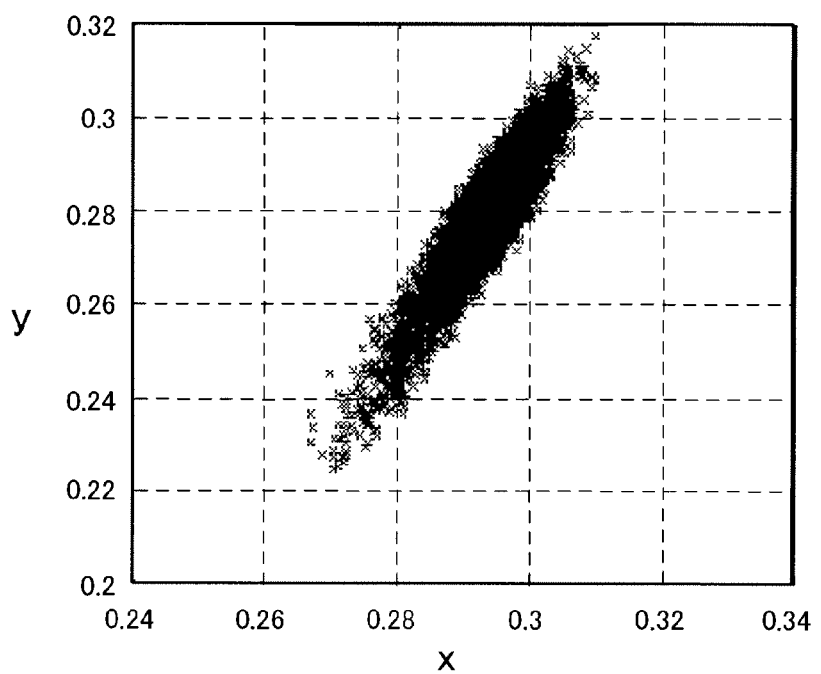
FIG. 16 is a graph showing color variation of light emitting apparatuses according to a comparative example 1.
Figure 17:
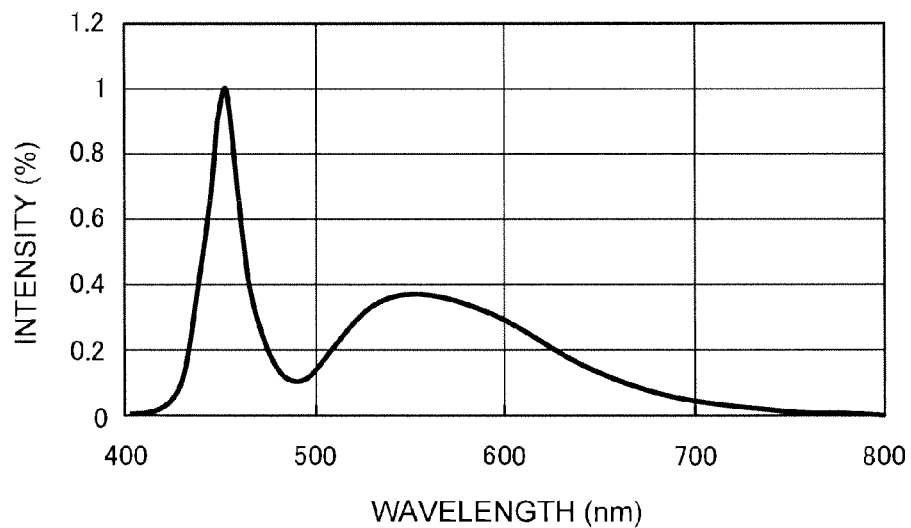
FIG. 17 is a graph showing the light emission spectrum of a light emitting apparatus including a blue LED and a YAG:Ce phosphor.
Figure 18:
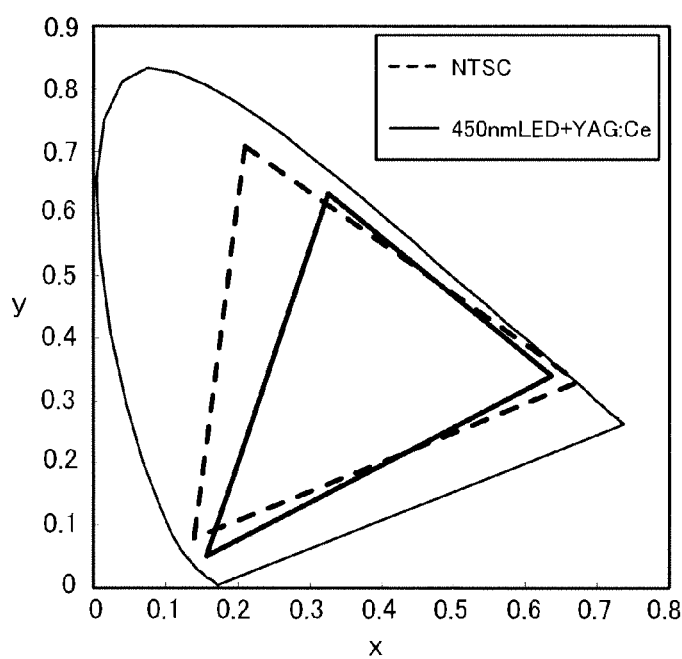
FIG. 18 is a graph showing the NTSC ratio of a light emitting apparatus including a 450-nm LED and a YAG:Ce phosphor in the chromaticity diagram.
Figure 19:
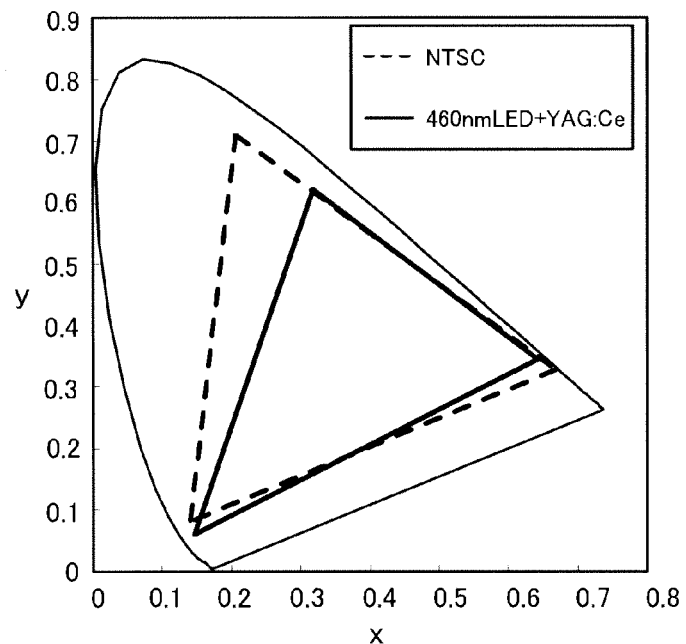
FIG. 19 is a graph showing the NTSC ratio of a light emitting apparatus including a 460-nm LED and a YAG:Ce phosphor in the chromaticity diagram.
Figure 20:
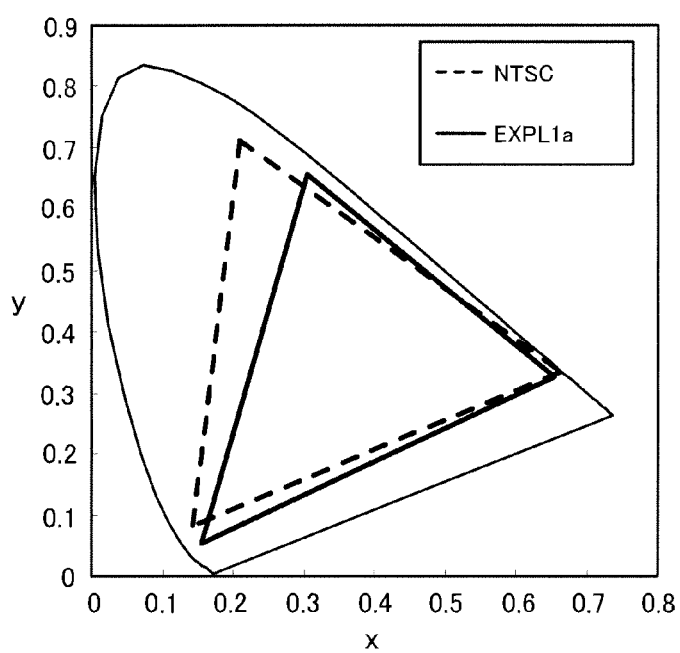
FIG. 20 is a graph showing the NTSC ratio of a light emitting apparatus according to an example 1a in the chromaticity diagram.
Figure 21:
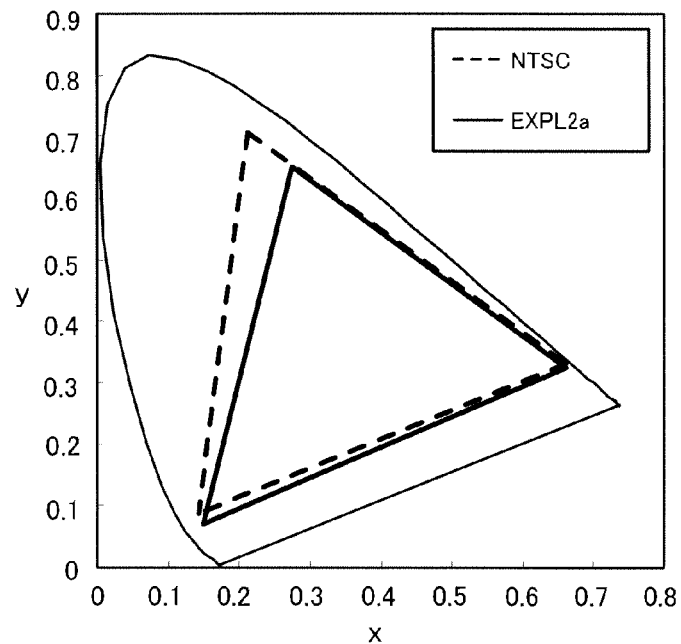
FIG. 21 is a graph showing the NTSC ratio of a light emitting apparatus according to an example 2a in the chromaticity diagram.
Figure 22:
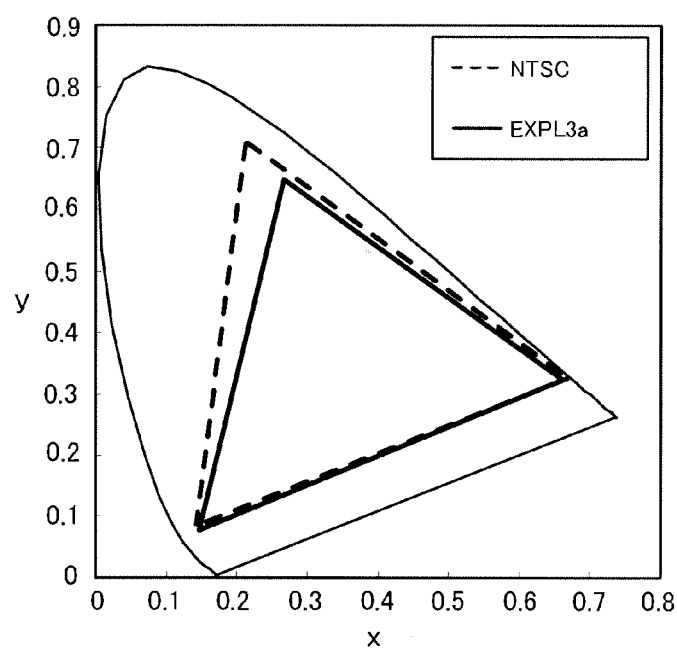
FIG. 22 is a graph showing the NTSC ratio of a light emitting apparatus according to an example 3a in the chromaticity diagram.
Figure 23:
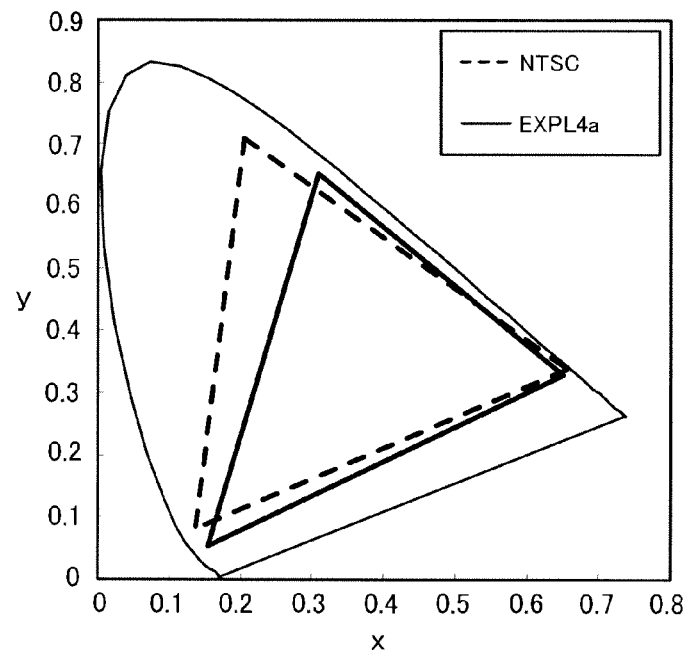
FIG. 23 is a graph showing the NTSC ratio of a light emitting apparatus according to an example 4a in the chromaticity diagram.
Figure 24:
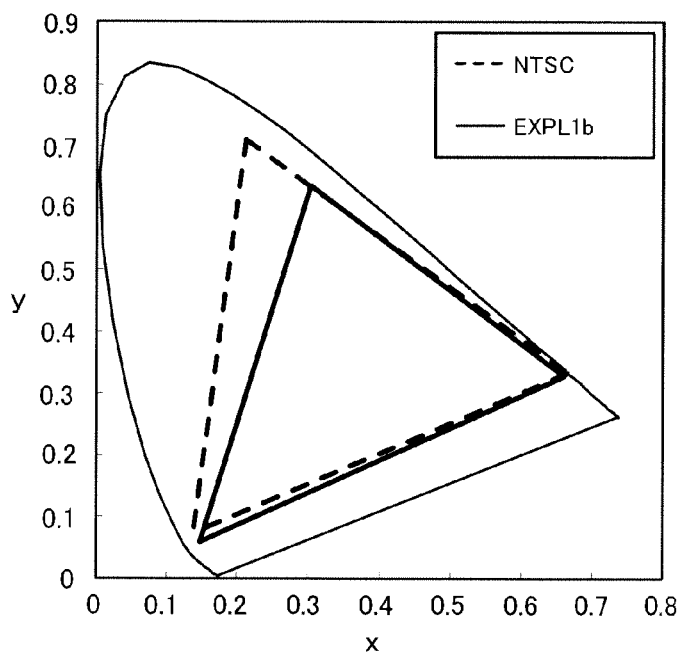
FIG. 24 is a graph showing the NTSC ratio of a light emitting apparatus according to an example 1b in the chromaticity diagram.
Figure 25:
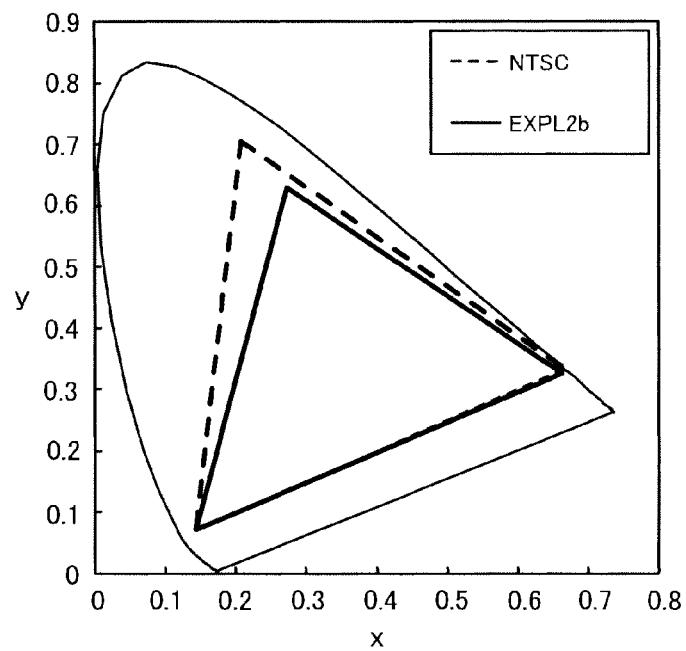
FIG. 25 is a graph showing the NTSC ratio of a light emitting apparatus according to an example 2b in the chromaticity diagram.
Figure 26:
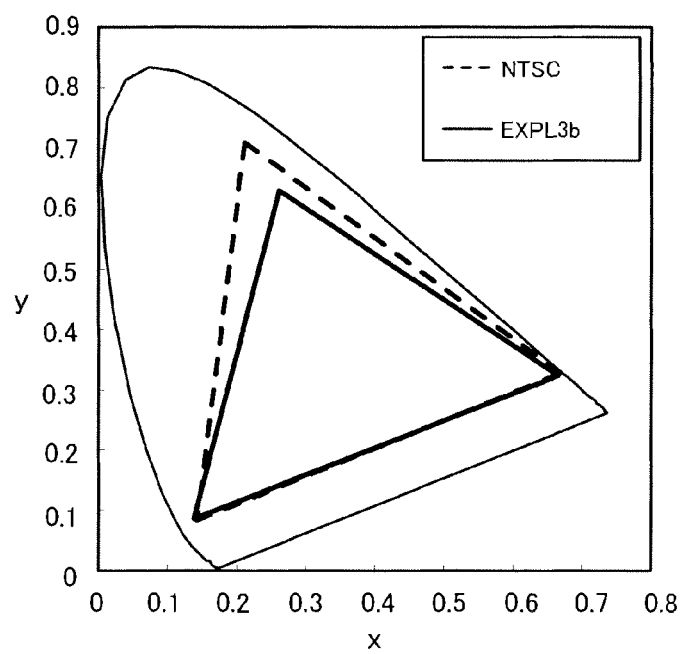
FIG. 26 is a graph showing the NTSC ratio of a light emitting apparatus according to an example 3b in the chromaticity diagram.
Figure 27:
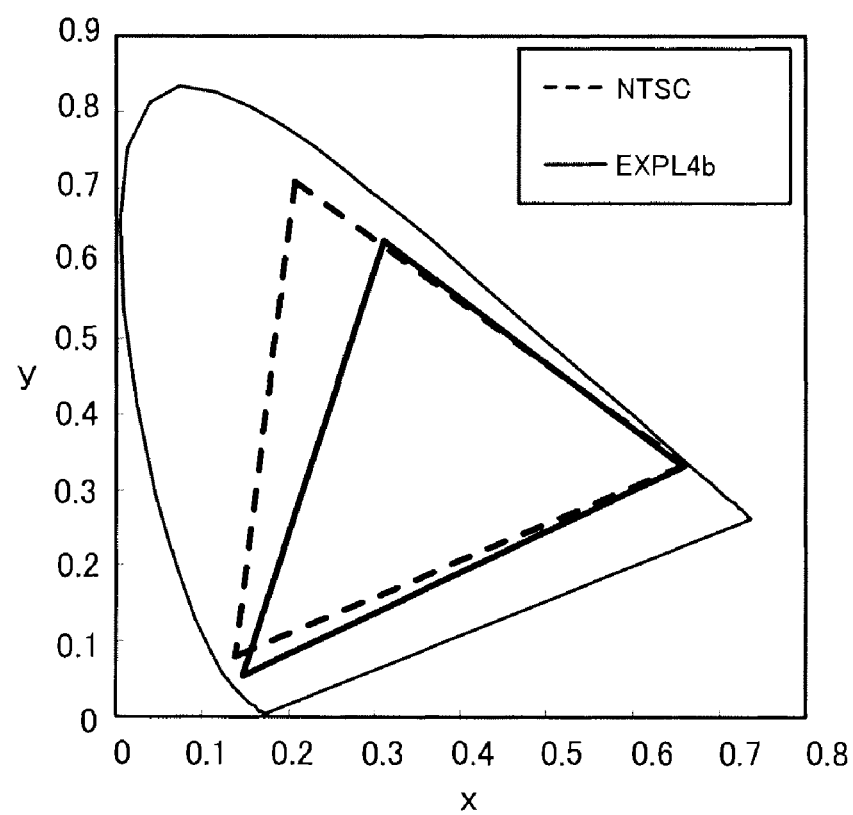
FIG. 27 is a graph showing the NTSC ratio of a light emitting apparatus according to an example 4b in the chromaticity diagram.
Figure 28:
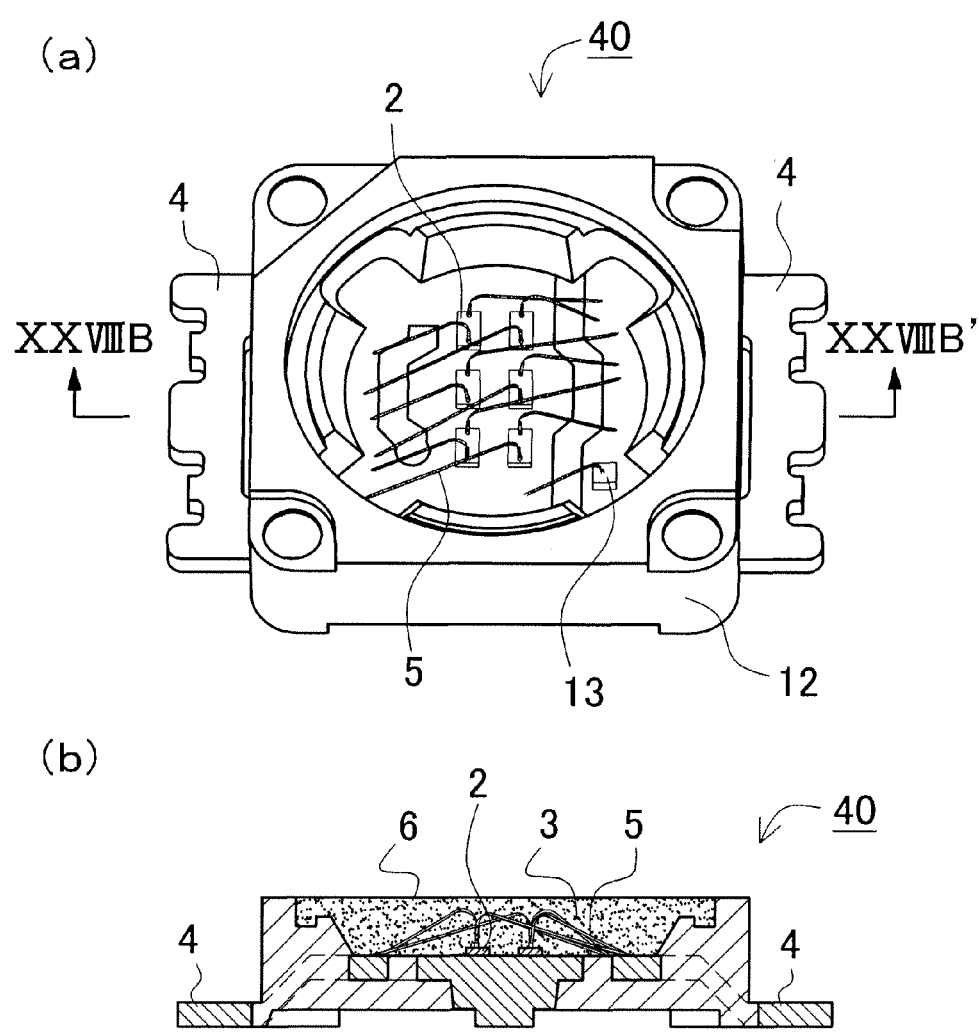
FIG. 28(a) is a perspective view showing a light emitting apparatus according to a second embodiment.
FIG. 28(b) is a cross-sectional view showing the light emitting apparatus shown in FIG. 28(a).
Figure 29:
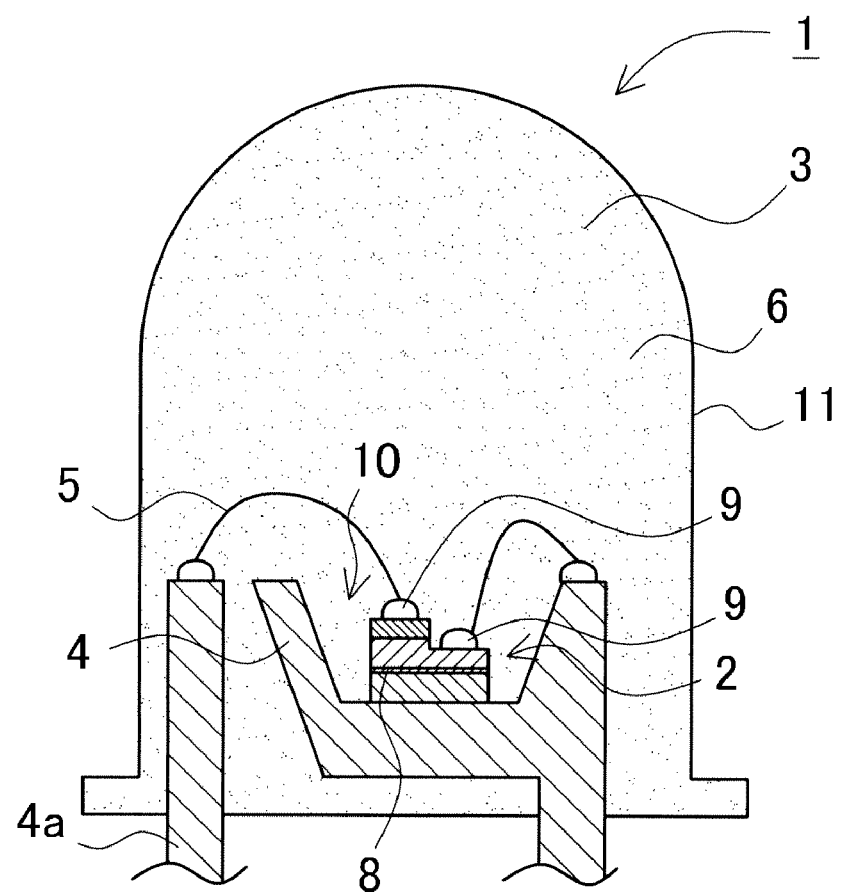
FIG. 29 is a cross-sectional view of a light emitting apparatus according to a third embodiment.
Figure 30:
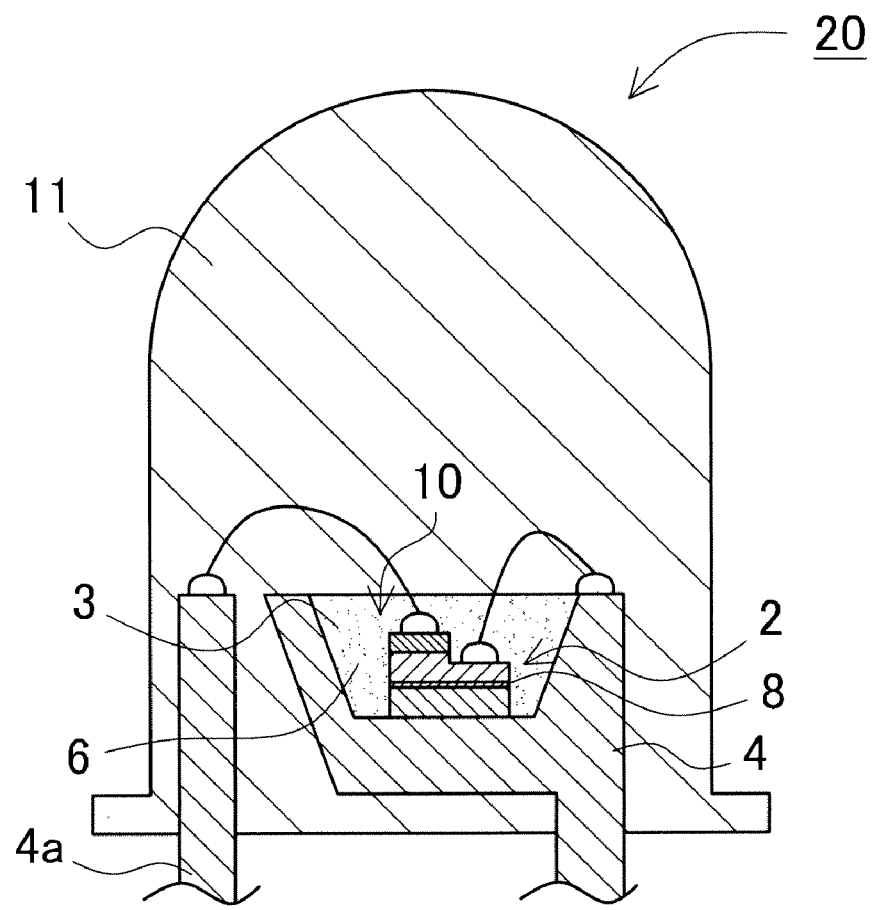
FIG. 30 is a cross-sectional view of a light emitting apparatus according to a fourth embodiment.
Figure 31:
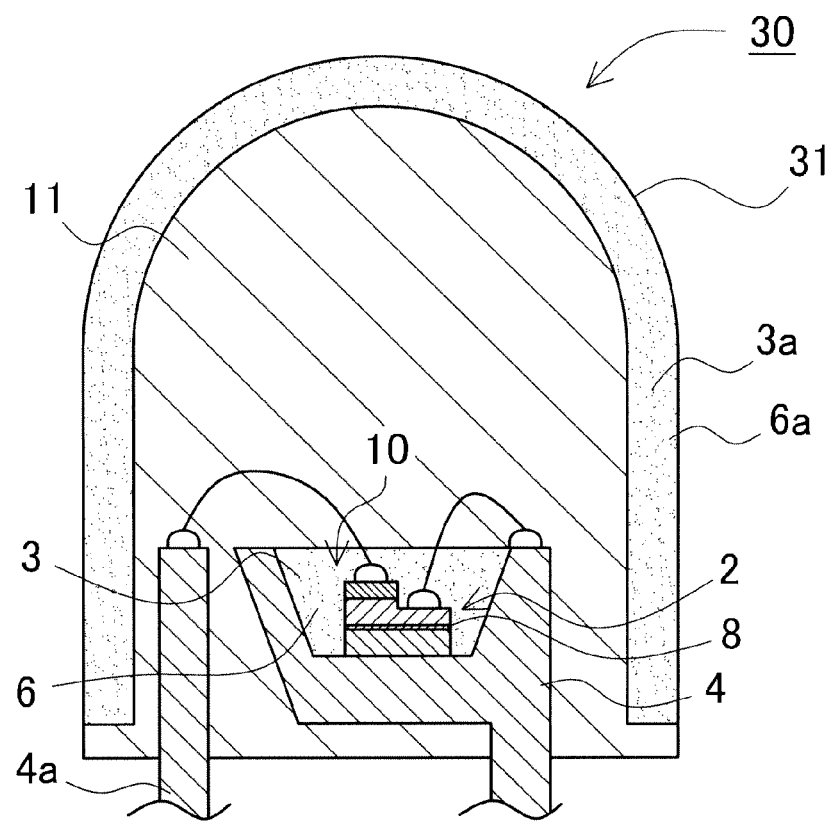
FIG. 31 is a cross-sectional view of a light emitting apparatus according to a fifth embodiment.
Figure 32:
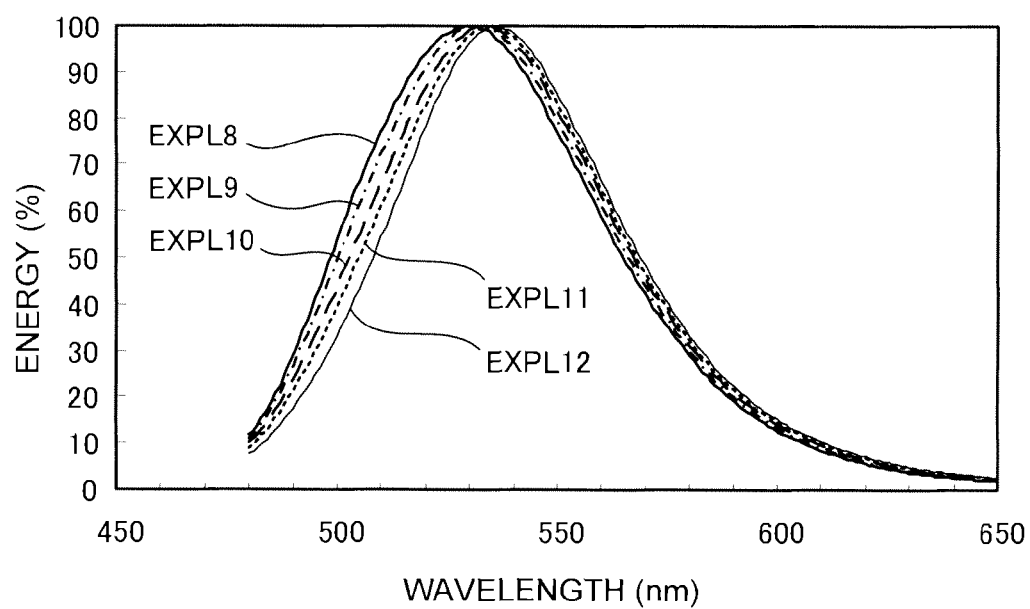
FIG. 32 is a graph showing the light emission spectra of phosphors according to examples 8 to 12.

What is claimed is:

1. A light emitting apparatus comprising:
a light emitting device that can emit a light component, and
three or more types of phosphors that can be excited by the light component emitted from said light emitting device to emit visible light components with wavelengths different from the wavelength of the light component emitted from said light emitting device, wherein three or more types of phosphors include
a red luminescent type phosphor containing at least one type of nitride phosphor selected from the group consisting of phosphors of the following general formulas (I) and (II), and
at least two types of green luminescent type phosphors selected from the group consisting of phosphors of the following general formulas (III) and (IV), wherein
said at least two types of green luminescent type phosphors have peak wavelengths in a range of not less than 529 to not more than 535 nm, wherein
a phosphor group is included that consists of phosphor types having an absolute specific gravity in a range of not less than 3.00 to not more than 4.30 among said three or more types of phosphors, and the difference between the absolute specific gravity of each phosphor type in said phosphor group and the mean absolute specific gravity of the phosphor types in said phosphor group falls within a range of ±16% of the mean absolute specific gravity of the phosphor types in said phosphor group, wherein the content of the phosphor types in said phosphor group is not less than 90% by weight of said three or more types of phosphors

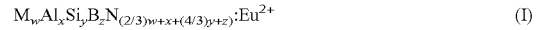

$$M_w Al_x Si_y B_z N_{(2/3)w+x+(4/3)y+z}:Eu^{2+} \qquad (I)$$

where M is at least one element selected from the group consisting of Mg, Ca, Sr and Ba, and $0.5 \leq w \leq 3$, $x=1$, $0.5 \leq y \leq 3$ and $0 \leq z \leq 0.5$,

$$M_p Si_q N_{(2/3)p+(4/3)q}:Eu^{2+} \qquad (II)$$

where M is at least one element selected from the group consisting of Mg, Ca, Sr and Ba, and $1.5 \leq p \leq 2.5$ and $4.5 \leq q \leq 5.5$,

$$M_x MgSi_z O_a X_b:Eu^{2+} \qquad (III)$$

where M is at least one element selected from the group consisting of Ca, Sr, Ba, Zn and Mn, X is at least one element selected from the group consisting of F, Cl, Br and I, and $6.5 \leq x \leq 8.0$, $3.7 \leq z \leq 4.3$, $a=x+1+2z-b/2$ and $1.0 \leq b \leq 1.9$,

$$Si_c Al_d O_f N_g:Eu^{2+} \qquad (IV)$$

where $c+d=6$, $5.0 \leq c < 6$, $0 < d \leq 1.0$, $0.001 < f \leq 1$, $7 \leq g < 8$.

2. The light emitting apparatus according to claim 1, wherein the difference between the mean particle diameters of the phosphor types in said phosphor group falls within a range of ±20%.

3. The light emitting apparatus according to claim 1, wherein the mean particle diameter of the phosphor types in said phosphor group is not less than 5 μm and not more than 30 μm.

4. The light emitting apparatus according to claim 1, wherein the surfaces of the phosphor types in said phosphor group is subjected to substantially the same surface treatment to provide a substantially uniform surface state.

5. The light emitting apparatus according to claim 4, wherein a compound containing at least Si is included in the surfaces of the phosphor types in said phosphor group.

6. The light emitting apparatus according to claim 1, wherein $Ca_8MgSi_4O_{16}Cl_{2-\delta}$:Eu ($0 \leq \delta \leq 1.0$) and $Si_{6-x}Al_xO_yN_{8-y}$:Eu ($x \leq 1, y \leq 1$) are included as said at least two types of green luminescent type phosphors, and $(Ca_{1-x}Sr_x)_2Si_5N_8$:Eu ($0 \leq x \leq 1.0$) and $(Ca_{1-x}Sr_x)AlSiB_yN_{3+y}$:Eu ($0 \leq x \leq 1.0$, $0 \leq y \leq 0.5$) are included as said red luminescent type phosphor.

7. The light emitting apparatus according to claim 1, wherein said light emitting device has a peak wavelength in a wavelength range from near ultraviolet to blue.

8. The light emitting apparatus according to claim 7, wherein said light emitting device has a peak wavelength in a range of 445 to 470 nm.

9. The light emitting apparatus according to claim 1, wherein the apparatus can emit white light by mixture of a plurality of different color light components, wherein
one of the plurality of different color light components is provided by blending two or more light components with different peak wavelengths the difference of which falls within a range of not more than 50 nm.

10. The light emitting apparatus according to claim 1, wherein the content of said at least two types of green luminescent type phosphors is not less than 60% and not more than 95% by weight of said three or more types of phosphors, and/or
the content of said red luminescent type phosphor is not less than 5% and not more than 40% by weight of said three or more types of phosphors.

* * * * *